United States Patent
Girard, Jr. et al.

(10) Patent No.: US 10,039,199 B2
(45) Date of Patent: Jul. 31, 2018

(54) DISCRETE PACKAGING ADAPTER FOR CONNECTOR

(71) Applicant: Amphenol Corporation

(72) Inventors: Donald A. Girard, Jr., Bedford, NH (US); Robert Auger, Amherst, NH (US); Mark W. Gailus, Concord, MA (US)

(73) Assignee: AMPHENOL CORPORATION, Wallingford, CT (US)

( * ) Notice: Subject to any disclaimer, the term of this patent is extended or adjusted under 35 U.S.C. 154(b) by 0 days.

(21) Appl. No.: 15/296,813

(22) Filed: Oct. 18, 2016

(65) Prior Publication Data

US 2017/0105303 A1    Apr. 13, 2017

Related U.S. Application Data

(63) Continuation of application No. 14/461,851, filed on Aug. 18, 2014, now Pat. No. 9,472,904.

(51) Int. Cl.
| | |
|---|---|
| *H05K 5/02* | (2006.01) |
| *H05K 5/06* | (2006.01) |
| *H05K 5/00* | (2006.01) |
| *H05K 1/18* | (2006.01) |
| *H05K 1/02* | (2006.01) |

(52) U.S. Cl.
CPC .......... *H05K 5/0247* (2013.01); *H05K 1/181* (2013.01); *H05K 5/0021* (2013.01); *H05K 5/065* (2013.01); *H05K 1/0231* (2013.01); *H05K 2201/10015* (2013.01); *H05K 2201/10515* (2013.01)

(58) Field of Classification Search
CPC ..... H01K 5/0247; H01K 1/181; H01K 5/0021
USPC ........................................................ 439/55
See application file for complete search history.

(56) References Cited

U.S. PATENT DOCUMENTS

| | | |
|---|---|---|
| 4,396,140 A | 8/1983 | Jaffe et al. |
| 5,007,844 A | 4/1991 | Mason et al. |
| 5,150,086 A | 9/1992 | Ito |
| 5,160,270 A | 11/1992 | Reymond |
| 5,241,134 A | 8/1993 | Yoo |
| 5,249,098 A | 9/1993 | Rostoker et al. |
| 5,287,076 A | 2/1994 | Johnescu et al. |
| 5,288,236 A | 2/1994 | McIntyre |
| 6,049,120 A | 4/2000 | Otani et al. |

(Continued)

OTHER PUBLICATIONS http://www.optomec.com/printed-electronics/aj-core-applications, printed May 28, 2014, 6 pages.

(Continued)

*Primary Examiner* — Alexander Gilman
(74) *Attorney, Agent, or Firm* — Blank Rome LLP

(57) ABSTRACT

An adapter has two conductors each with a U-shaped bend forming upper longer legs and lower shorter legs. The conductors face each other with the longer legs linearly aligned with each other and the shorter legs aligned with each other, thereby forming a first gap between the longer legs and a second gap between the shorter legs. The first gap is substantially smaller than the second gap, so that an electrical package can be placed across the first gap to contact the two upper longer legs, while the two shorter legs are spaced further apart to span a larger gap between conductors of a connector. Thus, the adapter enables the electrical package to be connected to conductors having a gap that is larger than the electrical package.

20 Claims, 15 Drawing Sheets

(56) References Cited

U.S. PATENT DOCUMENTS

| | | | | |
|---|---|---|---|---|
| 6,068,514 | A | 5/2000 | Zuin | |
| 6,285,542 | B1 | 9/2001 | Kennedy, III et al. | |
| 6,316,736 | B1 | 11/2001 | Jairazbhoy et al. | |
| 6,323,529 | B1 | 11/2001 | Nagahara | |
| 6,351,011 | B1 | 2/2002 | Whitney et al. | |
| 6,375,510 | B2 | 4/2002 | Asao | |
| 6,409,543 | B1 | 6/2002 | Astbury, Jr. et al. | |
| 6,429,383 | B1 | 8/2002 | Sprietsma et al. | |
| 6,612,023 | B1 | 9/2003 | Lichtenwalter et al. | |
| 6,925,885 | B2* | 8/2005 | Ishio | G01L 19/143 73/715 |
| 6,932,649 | B1* | 8/2005 | Rothermel | H01R 13/6658 439/620.01 |
| 6,949,405 | B2* | 9/2005 | Hagen | G01L 19/141 257/415 |
| 7,077,658 | B1* | 7/2006 | Ashman | H01R 12/523 439/65 |
| 7,285,018 | B2 | 10/2007 | Kenny et al. | |
| 7,285,846 | B1* | 10/2007 | Tran | H01L 23/495 257/666 |
| 7,612,296 | B2 | 11/2009 | Rohde et al. | |
| 7,637,749 | B2* | 12/2009 | Lang | H01R 23/68 439/65 |
| 7,887,371 | B2 | 2/2011 | Kenny et al. | |
| 7,972,144 | B2 | 7/2011 | Chang et al. | |
| 7,981,703 | B2* | 7/2011 | Fjelstad | H05K 1/144 257/668 |
| 7,995,353 | B2 | 8/2011 | Liao | |
| 8,137,139 | B2 | 3/2012 | Selwood | |
| 8,182,289 | B2 | 5/2012 | Stokoe et al. | |
| 8,203,488 | B2 | 6/2012 | Soler Castany et al. | |
| 8,241,067 | B2* | 8/2012 | Girard, Jr. | H01R 13/6466 439/620.21 |
| 8,282,412 | B1* | 10/2012 | Yaguchi | H01R 13/5804 439/492 |
| 8,303,315 | B2* | 11/2012 | Lee | H01R 12/57 439/79 |
| 8,382,524 | B2* | 2/2013 | Khilchenko | H01R 12/724 439/620.09 |
| 8,579,638 | B2* | 11/2013 | Schaarschmidt | H01R 12/585 439/82 |
| 8,591,257 | B2 | 11/2013 | Girard et al. | |
| 8,657,627 | B2* | 2/2014 | McNamara | H01R 13/6461 439/108 |
| 8,771,023 | B2* | 7/2014 | De Bruijn | H01R 23/688 439/701 |
| 9,065,213 | B2 | 6/2015 | Jeon | |
| 9,450,344 | B2* | 9/2016 | Cartier, Jr. | H01R 13/6585 |
| 9,466,910 | B2* | 10/2016 | Lee | H01R 13/405 |
| 9,472,904 | B2* | 10/2016 | Girard, Jr. | H01R 13/6625 |
| 9,722,366 | B2* | 8/2017 | Gailus | H01R 13/665 |
| 2002/0121680 | A1 | 9/2002 | Ahn et al. | |
| 2003/0073349 | A1* | 4/2003 | Nagao | H01R 4/028 439/620.24 |
| 2004/0110421 | A1* | 6/2004 | Broman | H01G 4/40 439/607.41 |
| 2005/0121224 | A1* | 6/2005 | Lien | H05K 1/182 174/250 |
| 2005/0283974 | A1* | 12/2005 | Richard | H01R 24/44 29/825 |
| 2005/0287869 | A1* | 12/2005 | Kenny | H01R 13/6625 439/620.12 |
| 2006/0053895 | A1* | 3/2006 | Kandler | G01L 19/0645 73/715 |
| 2006/0145358 | A1* | 7/2006 | Lee | H01L 23/32 257/778 |
| 2009/0156025 | A1* | 6/2009 | Lee | H05K 3/301 439/78 |
| 2010/0048040 | A1* | 2/2010 | Straka | H05K 1/0228 439/55 |
| 2011/0287663 | A1* | 11/2011 | Gailus | H01R 13/6608 439/620.21 |
| 2012/0235308 | A1* | 9/2012 | Takahashi | H01L 21/50 257/777 |
| 2013/0043575 | A1* | 2/2013 | Theuss | H01L 23/3107 257/676 |
| 2013/0130554 | A1* | 5/2013 | Girard | H01R 13/6587 439/626 |
| 2013/0152696 | A1* | 6/2013 | Kalz | B81B 7/02 73/777 |
| 2014/0008737 | A1* | 1/2014 | Koduri | G01P 15/0802 257/415 |
| 2015/0090030 | A1* | 4/2015 | Theuss | G01D 11/245 73/431 |
| 2015/0307344 | A1* | 10/2015 | Ernst | B81B 7/0048 257/417 |

OTHER PUBLICATIONS http://www.optomec.com/Additive-Manufacturing-Applications/Printed-Electronics-for-3D-Printing, printed Dec. 9, 2013, 2 pages.

* cited by examiner

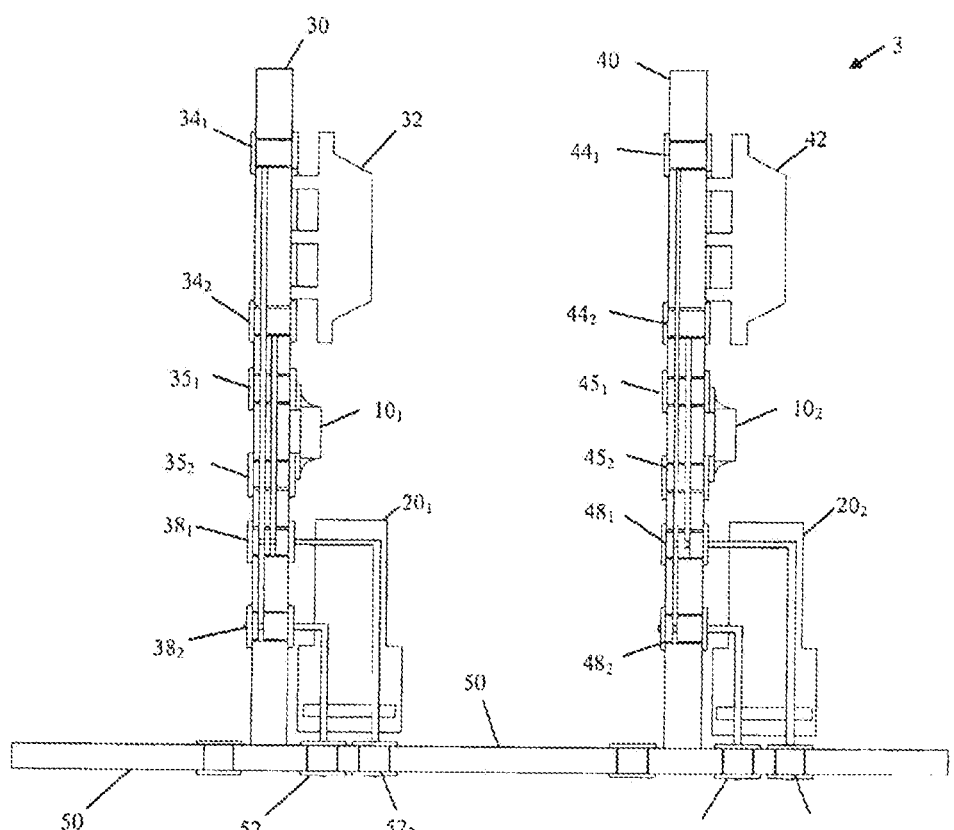
Figure 1A – PRIOR ART

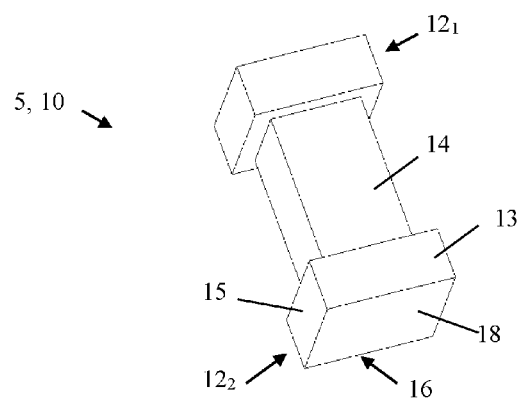
Figure 1B – PRIOR ART
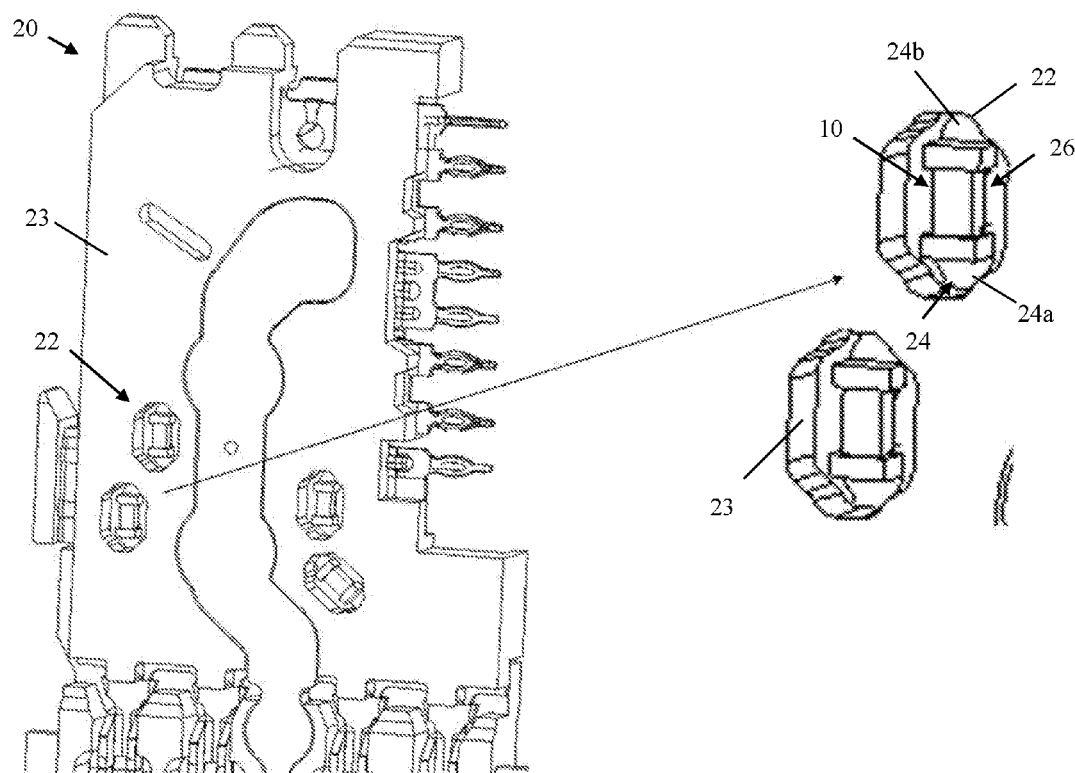
Figure 2A – PRIOR ART

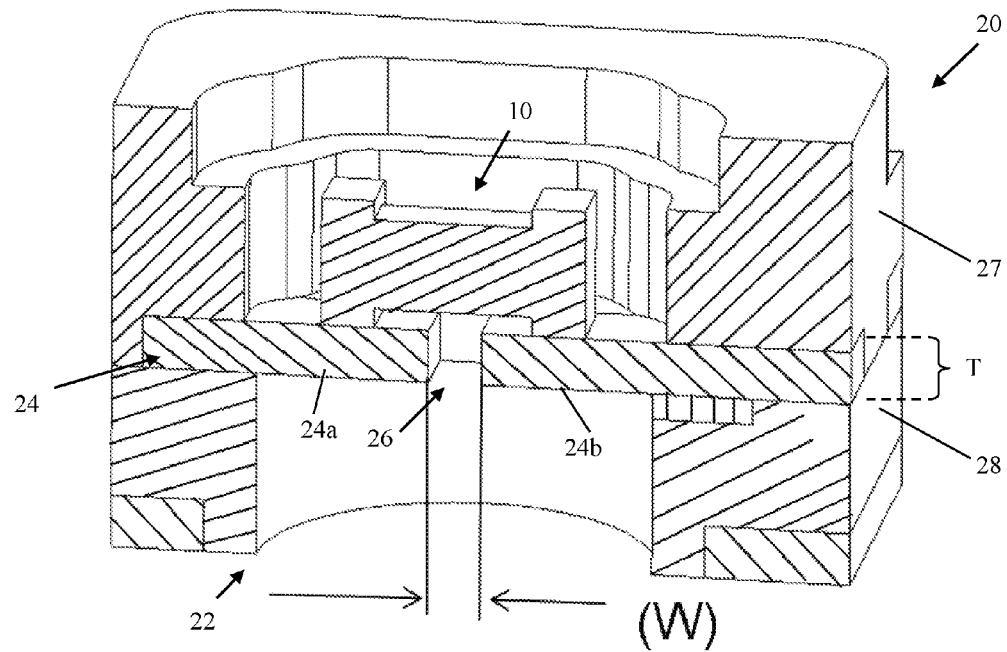
Figure 2B – PRIOR ART
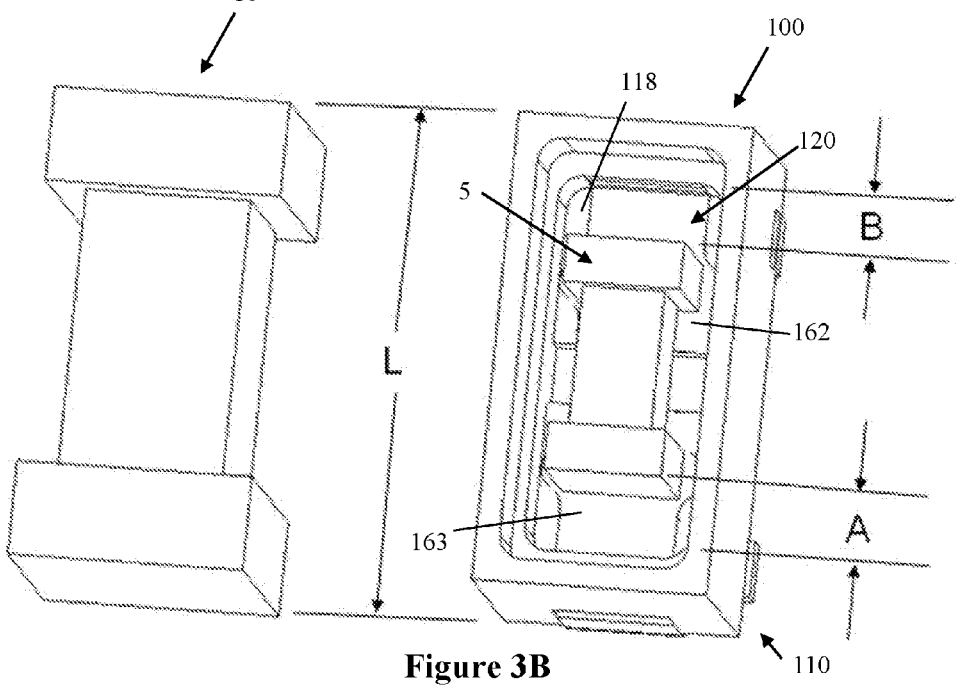
Figure 3B

DISCRETE PACKAGING ADAPTER FOR CONNECTOR

RELATED APPLICATIONS

This application is a continuation of U.S. patent application Ser. No. 14/461,851, filed on Aug. 18, 2014, now U.S. Pat. No. 9,472,904, issued on Oct. 18, 2016. The contents of that application is hereby incorporated by reference.

BACKGROUND OF THE INVENTION

Field of the Invention

The present invention relates to a connector adapter that receives an electronic component. More particularly, the present invention relates to a connector adapter package that receives a discrete electronic component and connects the discrete component to contacts intended for larger sized components.

Background of the Invention

FIG. 1 shows a traditional backplane construction having three substrates or printed circuit boards (PCB), for instance whereby two daughtercards PCBs 30, 40 are connected to each other across a backplane PCB 50. The daughtercards 30 are each electronically connected to the backplane 50 by a respective orthogonal electrical connector $20_1$, $20_2$, each having an electronic component 32, 42 such as a processing device (e.g., transmitter, receiver, processor, etc.). In a basic illustrative embodiment, the processing device 32 communicates with the processing device 42 by transmitting a signal along a signal path. Signals are sent by the processing device 32 across the board traces and the vias $34_1$, $34_2$, through the board 30 to the vias $38_1$, $38_2$ and to the first connector $20_1$. The signals then travel from the first connector $20_1$ through the backplane vias $52_1$, $52_2$, and then the second connector vias $54_1$, $54_2$ and to the second connector $20_2$. The signals then continue to travel from the second connector $20_2$, through the daughtercard vias $48_1$, $48_2$ to the processing device vias $44_1$, $44_2$ and to the processing device 42.

As discussed in U.S. Pat. No. 7,285,018 to Kenny which is hereby incorporated by reference, there is often the need to use a passive circuit element in the signal path. These passive circuit elements, such as capacitors, inductors, and resistors can be used to (a) block or reduce the flow of direct current caused by potential differences between electronic components 32, 42, (b) provide desired filtering characteristics, and/or (c) reduce data transmission losses. To address these issues, passive circuit elements $10_1$, $10_2$ have been added directly to the board 30 and/or board 40 respectively, as shown in FIG. 1A, and capacitors $10_2$ are sometimes located as close as possible to the pins of the receiver 42 (as opposed to on the transmit side in the embodiment shown in FIG. 1A).

Surface-mount technology (SMT) is a method for producing electronic circuits in which electronic surface-mounted devices (SMDs) or surface-mounted components (SMCs) are mounted or placed directly onto the surface of printed circuit boards (PCBs). The SMDs or SMCs are made in standardized package shapes and sizes. For instance, a package size "0402" device has rectangular size with a width of 0.50 mm, a height of 0.50 mm, and a length of 1.00 mm; a "0201" device is half that size, with a width of 0.25 mm, height of 0.25 mm, and a length of 0.50 mm; and a "01005" device has a width of 0.12 mm, height of 0.12 mm, and length of 0.25 mm. The size of the device can affect the value and application of the package. For instance a "0402" capacitor can have a capacitance of 100 Picofarads, whereas a 01005 capacitor has a capacitance of 50 Picofarads.

An example of a standard discrete passive device 10 for a capacitor (which can be used for the capacitors $10_1$, $10_2$ of FIG. 1A) is shown in FIG. 1B. The discrete device (or package) 10 includes two end terminals or members $12_1$, $12_2$ and a center body member 14 extending from one end member $12_1$ to the other end member $12_2$. The capacitor package 10 is shown in block form and the end members $12_1$, $12_2$ enlarged (with respect to the body) for ease of illustration, with the package 10 having a generally rectangular elongated shape. The center body member 14 is rectangular, and the end members $12_1$, $12_2$ are rectangular, with a longitudinal axis of the center body member 14 extending substantially perpendicular to the longitudinal axis of the end members $12_1$, $12_2$. Thus, the center body 14 has two opposite ends, and an end terminal 12 is located at each of those ends. The end members $12_1$, $12_2$ are longer than the width of the center body member 14, as shown. The end members $12_1$, $12_2$ each have a top surface or face 13, side surfaces or faces 15, a bottom surface or face 16, and an end surface or face 18. Each of the package sizes, 0402, 0201 and 01005, have a similar shape, and only differ in size. It should be recognized, however, that any suitable shape and size can be provided, and for instance the package 10 need not be rectangular in shape and the end members $12_1$, $12_2$ need not be wider than the center body member 14.

Referring to FIG. 1A, when the passive circuit element $10_1$, $10_2$ are located on the board 30, 40, it takes up precious space on the board surface and contributes to SDD21 signal attenuation. In addition, the passive circuit vias $35_1$, $35_2$, and vias $45_1$, $45_2$ respectively, can create capacitance and reflection in the through holes, reflections of the via stubs, skews caused by the lack of routing space, plated through-hole defects (voids and cracks), back drilling errors/tolerances, localized cross talk between vias and traces, and uses valuable switch card space in high traffic areas.

One technique for addressing those issues is disclosed in U.S. Pat. No. 8,591,257 to Girard et al., which is incorporated herein by reference. In that patent, the passive circuit packages are placed in the connector wafer $20_1$ and/or $20_2$, rather than on the board 30, 40 so that the capacitors $10_1$, $10_2$ are not needed. As illustrated in the wafer 20 of FIGS. 2A and 2B, openings 22 are provided in the wafer housing (over mold 23) to expose a conductor 24 of the lead frame. A gap 26 is created in the conductor 24, resulting in two conductor ends 24a, 24b, and the package 10 is placed across the gap to connect with the conductor ends 24a, 24b. The bottom face 16 of the end members $12_1$, $12_2$ are adhered to the top surface of the exposed ends 24a, 24b of the conductor 24, such as by an adhesive or solder. As best shown in FIG. 2B, the wafer 20 includes a top layer 27 of the over mold 23, a bottom layer 28 of the over mold 23, and the conductors 24a, 24b of the lead frame positioned there between. The opening 22 is provided in the top layer 27 and the bottom layer 28 that exposes the conductor leads 24a, 24b. The package 10 is positioned inside the opening 22 in the top layer 27 to connect with the two conductors 24a, 24b of the lead frame. Packages are also shown in the connector of U.S. Pat. No. 8,382,524 to Khilchenko, which is hereby incorporated by reference.

The conductor 24 has a thickness T and the gap 26 has a width W. The width W of the gap 26 can be larger than or equal to the thickness T of the conductor 24. However, the size of the gap 26 is dependent on the thickness T of the conductor 24, because the gap 26 cannot be reliably made smaller than the thickness T of the conductor 24. Thus, the width W of the gap 26 is only made larger or equal to the thickness T of the conductor 24. And the thickness T of the conductor 24 can only be reduced to a certain extent, based on a number of factors such as: characteristic impedance Zo targets, progressive stamping die tool capabilities, normal force targets for beam design/beam strength due to normal force or spring force (e.g., minimum end of life normal force of 40 grams) for the separable mating interfaces, coined features needs and strength requirements such as those tied to press fit eye of the needle dynamic sections, resistance to damage, shape change, location changes during manufacturing processes, such as but not limited to molding, stamping, reeling, plating, assembly and handling.

Accordingly, the gap 26 has to be equal to or larger than the thickness T of the conductor 24, which means that the package 10 has to be large enough to span the gap 26. Consequently, the package (such as a capacitor) 10 of FIGS. 1-2 may be unable to electrically connect to the leads 24a, 24b of the lead frame if the package is too small to span the width W of the gap 26. More specifically, the gap 26 may be too large for the smaller package such as the 0201-sized package 5 to span the gap 24 and connect with the conductors 24a, 24b, such that only the larger package such as the 0402-sized package 10 (FIG. 1B) can be utilized. Thus, there is a need for a wafer 20 configured to electrically connect packages (such as capacitors) smaller than the package 10 of FIG. 1B between the leads 24a, 24b of the lead frame.

Another technique to address the issues faced by having a passive circuit device package 10 on the boards 30, 40 is shown in U.S. Pat. No. 8,241,067 to Girard, Jr. et al., which is hereby incorporated by reference. In that patent, the capacitor is located on the board close to one of the signal conductor tails of the connector. The capacitor does not have its own vias (as in FIG. 1 above), but instead shares a via with that signal conductor tail.

SUMMARY OF THE INVENTION

Accordingly, it is an object of the invention to increase the density of conductor leads and packages and the speed of the signals carried on those conductor leads. Due to Transmit/Receive (Tx/Rx) system constraints, however, one (or both) of the connector(s) of FIGS. 1-2 may need a capacitor with specific properties (e.g., 100 Picofarads of capacitance), and at present utilize a 0402 size package. Capacitance is related to package size, materials used and internal design. Each capacitors style and body sizes will deliver a minimum capacitance. The larger size of the 0402 package hinders the ability to increase the density of the connector. In addition, the ability to separate traces to solder in a smaller device is limited by material thickness of the lead frames. This part of lead frame design is related to both electrical and mechanical requirements such as co-planar coupling of differential pairs, beam design for mating interface and press fit dynamic section requirements.

It is a further object of the invention to provide an adapter that can connect multiple packages in parallel and/or in series. It is still a further object of the invention to provide an adapter that can enable a package to connect with conductor leads that are spaced apart by a distance that is greater than the size of the package.

In accordance with these and other objectives, an adapter is provided with two conductors, each with a U-shaped bend forming upper longer legs and lower shorter legs. The conductors face each other with the longer legs aligned with each other and the shorter legs aligned with each other, thereby creating first gap between the longer legs and a second gap between the shorter legs. The first gap is substantially smaller than the second gap, so that an electrical package can be placed across the first gap to contact the two upper longer legs, while the two shorter legs are spaced further apart to span a larger gap between conductors of a connector. Thus, the adapter enables the electrical package to be connected to conductors having a gap that is larger than the electrical package.

These and other objects of the invention, as well as many of the intended advantages thereof, will become more readily apparent when reference is made to the following description, taken in conjunction with the accompanying drawings.

BRIEF DESCRIPTION OF THE FIGURES

FIG. 1A shows a conventional backplane with 2 daughter card construction;

FIG. 1B shows a capacitor package in accordance with the prior art;

FIGS. 2A, 2B show the capacitor package of FIG. 1 fitted in a wafer;

FIG. 3B is a top view of the adapter of FIG. 3A without encapsulant, and compared to the size of a standard 0402 capacitor package;

DETAILED DESCRIPTION OF THE PREFERRED EMBODIMENTS

Figure 3A:
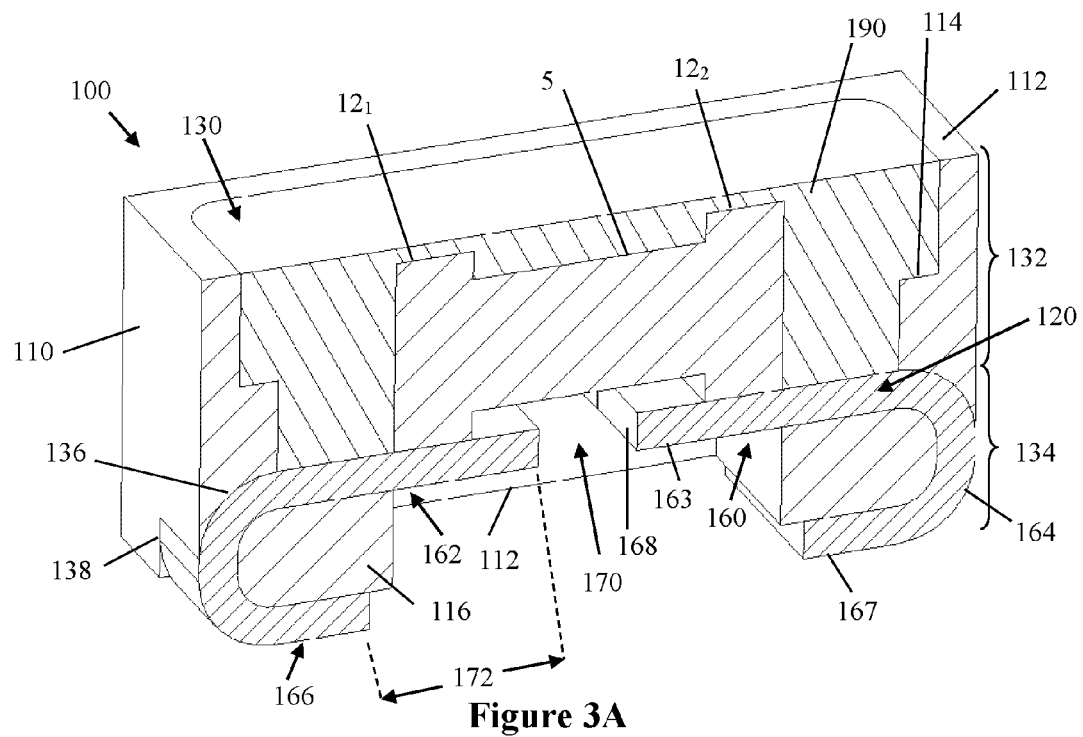
FIG. 3A is a perspective cross-section of the capacitor package of FIG. 1 in an adapter in accordance with an embodiment of the invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Turning to the drawings, FIG. 3A is a cross sectional view of an adapter 100 according to an exemplary embodiment of the present invention. The adapter 100 is especially designed for use with the smaller package 5. The capacitor adapter 100 includes electrically conductive contact members 160 and an electrically insulative housing 110. The housing 110 can have a rectangular shape that generally corresponds to the shape of the package 5. Accordingly in the embodiment shown, the housing 110 has four outer circumferential walls 112 formed by two longitudinal side walls and two transverse end walls, which together define an interior space 130. The adapter 100 includes an upper section 132 and a lower section 134. The package 5 is received in the interior space 130 at the upper section 132. The bottom and top of the housing are open, though the housing 110 can optionally be filled with the encapsulant or potting filling compound 190.

The outer circumferential wall 112 includes an optional interior shelf 114 that projects inwardly and separates a top portion and a middle portion of the encapsulant 190. The shelf 114 helps support the encapsulant 190 and prevent it from escaping the interior space 130 during its cure cycle. End support members 116 are formed at the lower section 134 of the housing 110. The support members 116 are formed at the shorter lateral ends of the housing 110, and have a straight inwardly-facing side and curved outwardly-facing sides.

Each of the contact members 160 has opposite ends and is bent to form shorter legs 166, 167, curved portions 164, and longer legs 162, 163. Each of the curved sections 164 has a 180-degree turn to form a U-shape, such that the longer legs 162, 163 are substantially parallel to each of the shorter legs 166, 167 and each of the contact members 160 generally forms a "J" shape. The longer legs 162, 163 of the contact member are configured to electrically connect with an electrical component. For example, each of the longer legs 162, 163 can be electrically connected to the end members $12_1$, $12_2$ of the package 5. The shorter legs 166, 167 of the contact member 160 are configured to electrically connect with a printed circuit board or connector. For example, each of the shorter legs 166, 167 can be electrically connected to the conductor leads 24a, 24b illustrated in FIGS. 2A, 2B.

Because the shorter legs 166, 167 are shorter than the longer legs 162, 163, the longer leg 162, 163 extend further inward toward the center of the interior space 130 of the housing 110. Thus, there is a distance 172 between the distal end 168 of the longer leg 162 and the distal end of the shorter leg 166. Accordingly, the contact portions of the shorter legs 166, 167 are further apart than the contact portions of the longer legs 162, 163. And as shown, the contact portions of the shorter legs 166, 167 are further apart than the end members $12_1$, $12_2$ of the package 5. That is, the distal ends of the shorter legs 166, 167 are separated by a distance that is greater than the length of the package 5. As a result, the shorter legs 166, 167 are designed to connect with contacts (such as conductor leads 24a, 24b) that the package 5 itself is too small to connect with.

The longer legs 162, 163 are aligned with and co-planar with each other. The shorter legs 166, 167 are also aligned with and co-planar with each other. And, the longer legs 162, 163 are parallel to the shorter legs 166, 167. The longer and shorter legs 162, 163, 166, 167 can each be elongated. The longer legs 162, 163 do not touch each other, whereby a gap 170 is formed between the distal ends 168 of the two longer legs 162, 163. The shorter legs 166, 167 also do not touch each other, and a gap is formed between the distal ends of the two shorter legs 166, 167. The contact members 160 can be formed from a single elongated thin piece of metal. The ends can be bent to form the curved portion 164, and the gap 170 can be stamped.

The thickness of the contact member 160 (FIG. 3A) does not have the same constraints as the lead frame 24 of the wafer 20 (FIGS. 1-2), and therefore the contact member 160 can be thinner (or thicker) than the lead frame 24 of the wafer 20. That is, the contact member 160 does not form out of the same base material as the lead 24. The base thickness of the lead 24 is tied to connector's desired properties. This allows the contact member 160 to be gauged to desired properties, such that the adapter can have independent functions related to connector base materials. Because the contact member 160 can be made thinner, a smaller gap 170 can be formed in the contact member 160 than the gap 26 (FIG. 1B) formed in the lead 24. In one example embodiment, typical conductor 24 thickness is in the range of 0.20-0.30 mm and typical adapter base materials for the contact 160 can range between foils of 0.05-0.10 mm thick. Because the gap 170 of the capacitor adapter 100 may be smaller than the gap 26 of the wafer 20, the capacitor adapter 100 can accommodate smaller packages 5 than packages that are directly connected to the lead frame 24 of the wafer 20. For example, as shown in FIG. 3A, the capacitor adapter 100 is electrically connected to the smaller package 5 since the gap 170 is small enough for the smaller package 5 to span the gap 170. The smaller package 5 may be, for example, a 0201-size device, which is half the size of the larger 0402-size package 10 illustrated in FIGS. 1-2.

The contact members 160 can include end support members 116. Each of the end support members 116 are formed between one of the longer legs 162, 163 and the respective one of the shorter legs 166, 167, as well as two of the respective outer circumferential walls 112 of the housing 110. The end walls 112 of the housing 110 have a slot 136 formed at the lower section 134 of the adapter 110. An opening 138 is also provided at the bottom center of the end walls 112. The proximal end and top of the curved portion 164 of the contact member 160 are positioned in the slot 136 and opening 138 in the end walls 112 of the housing 110. The opening 138 is optional and can be used to mold and stamp this area. For instance, the opening 138 allows exposed metal that can form a fillet when soldered to the lead frame conductor 24. The fillets add strength to the solder bond between the conductor 24 and the adapter conductor 160, leading to improved long term package reliability and resistance to shock, environmental stress and strains due to thermal cycling in situ and during press fit assembly.

FIG. 3B is a top-down view of the capacitor adapter 100 in accordance with a non-limiting exemplary embodiment of the present invention. The capacitor adapter 100 is shown alongside a larger 0402-size package 10. As illustrated, the adapter 100 is substantially the same size and shape as the conventional larger 0402-size package 10. The connector adapter 100 is configured to receive a standard smaller 0201-size device 5. Because the capacitive adapter 100 occupies the same space as the larger 0402-size package 10, the capacitor adapter 100 enables the smaller 0201-size device 5 to electrically connect with the leads 24a, 24b that are normally sized and spaced for the larger 0402-size package 10. That is, the gap 26 between the leads 24a, 24b is too large for the smaller 0201-size device 5 to connect with the leads 24a, 24b. However, the shorter legs 166, 167 of the contact member 160 are further apart and can span the larger gap 26 between the leads 24a, 24b. And the longer legs 162, 163 of the contact member 160 are closer together so that the smaller package 5 can span the gap 170 between the longer legs 162, 163.

The capacitor adapter 100 also provides mating surfaces that are configured to electrically connect to devices 5 of varying sizes either smaller or larger than the smaller packages 5 and/or the larger packages 10. That is, the gap 170 between the longer legs 162, 163 can made larger or smaller to accommodate different size packages 5, 10, or a larger package 10 can be utilized with a smaller gap 170. In addition, the adapter 100 can be made to fit in different size gaps. The shorter legs 166, 167 can be separated further or closer together to mate with leads 23a, 23b that are further or closer apart.

Figure 3C:
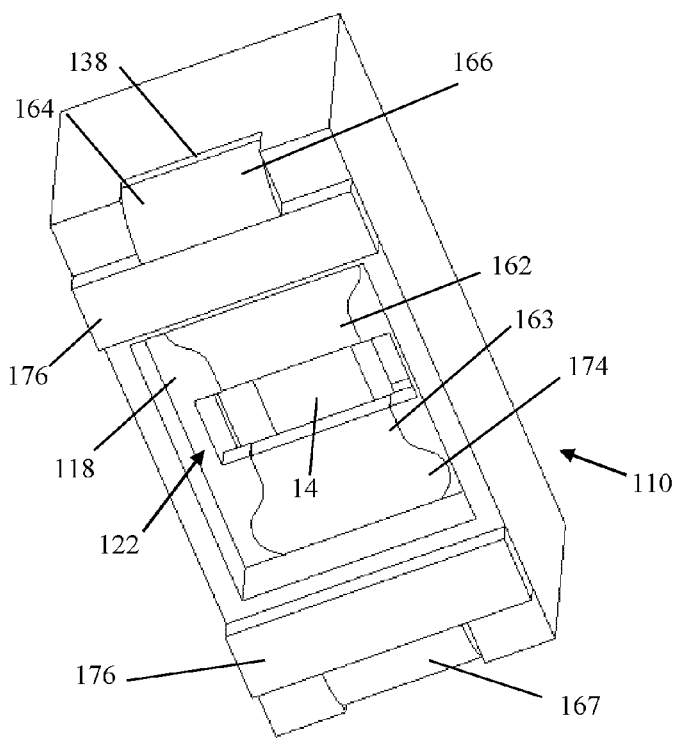
FIG. 3C is a bottom view of the adapter of FIG. 3A.

Still referring to FIG. 3B, the size of the connector adapter 100 can be reduced by dimensions A+B because shorter legs 166, 167 (FIG. 3A) of a reduced-size adapter 100 may be configured to electrically connect to the leads 24a, 24b of the lead frame 24 illustrated in FIG. 2B. As best shown in FIGS. 3B, 3C, the capacitor adapter 100 includes a divider 118 formed about midway down in the housing 110, which together with the longer leg portion 163 of the contact member 160, defines the upper section 132 and the lower section 134. The divider 118 extends inward from the side outer walls 112 and joins with the support members 116 at the lateral ends of the housing 110. In addition, a channel or recess 120 is formed at the middle of the divider 118, and the longer leg portion 163 is received in that recess 120. The contact member 160 can be sufficiently rigid so that the longer leg portions 162, 163 can support the device 5.

FIG. 3C is a bottom-up view of the capacitor adapter 100 and the center body member 14 of a package 5, according to an exemplary embodiment of the present invention. The housing 110 includes two openings 138. The curved portions 164 of the contact members 160 are at the openings 138. Each of the shorter legs 166, 167 of the contact member 160 include a contact end 176 configured to electrically connect to a printed circuit board (e.g., the leads 24a, 24b of the lead frame 24 illustrated in FIG. 2B). The contact ends 176 are wider than the curved portions 164, and the longer legs 162, 163. The contact ends 176 are elongated with a longitudinal axis substantially perpendicular to the longitudinal axis of the adapter housing 100 and a longitudinal axis of the longer legs 162, 163. The contact ends 176 can extend the entire width of the housing 110 to provide the greatest contact area and a reliable connection to a mating contact. In addition, the contact ends 176 are beneath the housing 110, so that they are the bottommost part of the adapter 100. Thus, the longer legs 162, 163 are at the interior space 130 of the housing 110, while the contact ends 176 are external to the housing 110. In this manner, the contact ends 176 (i.e., the contact portions of the shorter legs 166, 167) can come into contact with the mating connector without any obstruction, and the housing 110 sits on top of the shorter legs 166, 167. The contact ends 176 are flat and co-planar so that the adapter 100 is steady when positioned with respect to the mating connector. It should be recognized that other suitable alternatives are available. For instance, while the contact ends 176 are wider than the rest of the contact member 160, it need not be wider. Alternatively, the shorter legs 166, 167 may have a narrower section that leads to a wider section.

The capacitor adapter 100 also includes a divider 118 formed about midway down in the housing that, together with the long leg 162, 163 of the contact members 160, define the upper section 132 and the lower section 134 of the housing 110. The divider 118 extends inward from the side outer walls 112 and joins with the support members 116 at the lateral ends of the housing 110. In addition, a channel or recess 120 is formed at the middle of the divider 118 above the support members 116, and a slot 136 and opening 138 are formed in the shorter transverse end walls 112.

As best shown in FIG. 3C, the longer legs 162, 163 can each have a widened receiving portion 174 that curves or extends outward. That receiving portion 174 receives and electrically connects with the bottom face 16 of the respective end terminals 12 of the package 10. The widened receiving portions 174 provides better target registration and ensures a more reliable solder joint with the terminals 12 of the package 10. In addition, if the wafer 20 has fully or partially exposed air sections around the lead frame 24 (as opposed to a plastic-covered metal lead frame 24), the dielectric constant changes in that area which leads to an unintended change in the impedance. The added metal in the widened receiving portions 174 mitigates that impedance change. The widened receiving portions 174 can also be tuned to provide the desired impedance. In addition, the divider 118 and longer legs 162, 163 are similar in width, so that the top and bottom surfaces of the divider 118 are uniform and flush with the top and bottom surfaces of the longer legs 162, 163, respectively. An opening 122 can be provided in the divider 118 at the gap 170 between the distal ends 168 of the longer leg 162, 163.

While the contact ends 176 and portion of the shorter legs 166, 167 are positioned at or on the bottom of the housing 110, the remainder of the contact member 160 is received in the housing 110. The distal portion of the longer legs 162, 163 are positioned between the divider portions 118, and the proximal portion of the long leg 162 is received within the recess 120 of the divider portion 118. The long leg 162 is supported by the support member 116, and so can extend outward beyond the support member 116 into the space created between the two support members 116.

To construct the adapter 100, the contact 160 is provided as a single elongated thin strip. The contact 160 is then bent to form the curved portion 164 and legs. The housing 110 is then formed about the contact 160 as a single integral molded member. The gap 170 in the contact 160 can be stamped either before or after the molded housing is formed, by supporting the longer legs 162, 163 from below and stamping the gap from the top. Once the housing 110 and contact member 160 are assembled, the connector device 5 is placed on the exposed longer legs 162, 163 of the contact member 160. The bottom face 16 of the component 5 can be adhered to the contact portion 163, such as by glue or solder. Thus, the bottom face 16 of each end terminal 12 comes into contact and electrical communication with a respective one of the longer legs 162, 163 of the contact member 160. The center body member 14 of the device 5 extends across the gap 170. Once the package 5 is bonded to the longer legs 162, 163, the encapsulant 190 is added, and the shorter legs 166, 167 are then bonded to the wafer/connector.

The upper section 132 of the interior space 130 of the housing 110 is then optionally filled with an encapsulant 190. The encapsulant 190 is sufficiently viscose so that it does not escape through the opening 170. The encapsulant 190 binds to the interior surface of the outer circumferential walls 112, as well as the shelf 114, and the packaging device 5, thereby fixing the packaging device 5 in position on the contact member 160 and sealing the component 5 within the housing 110. The encapsulant 190 fills the entire upper section 132 of the interior space 130. The housing 110 and encapsulant 190 are formed of an insulative material, so as to not interfere with operation of the device 5. The encapsulant 190 can be a liquid epoxy or other suitable material, and can be UV cured from the top and/or bottom of the housing 110.

Accordingly, the connector adapter 100 of FIGS. 3A-3C is configured to connect a smaller 0201-size device 5 to the mating contacts that are sized to accept a larger 0402-size device. More specifically, the 0201-size package 5 is positioned on the first contact portion at the upper (upward-facing) surface of the longer leg 163 of the contact member 160, which is at the upper section 132 of the housing 110. The second contact portions at the lower (downward-facing) surface of the shorter leg 167 of the contact member 160 are positioned wider apart than the first contact portions 163, and are configured to connect with mating contacts of a connector that are sized to accept a larger 0402-size package. Thus, the smaller 0201-size package 5 is in electrical communication with the mating contacts of the mating connector. Using a smaller package 5 adds new abilities to tune connector impedance around the device and improve device placement opportunities in the connector. Using smaller capacitor bodies, such as the 0201-size package 5, reduces the metal, ceramic and air disturbances associated with the capacitor and enables the use of capacitors in areas that cannot accommodate a larger capacitor. The configuration can also be made smaller with –01005 capacitor bodies.

Figure 4A:
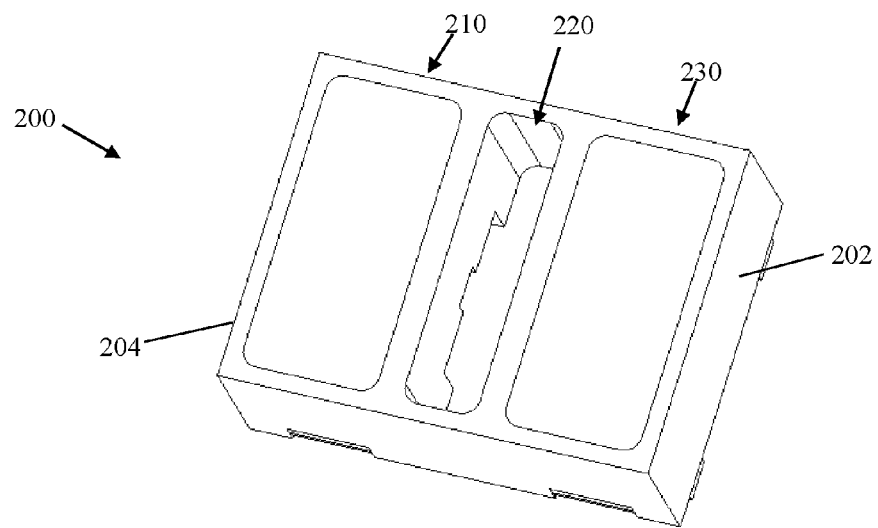
FIG. 4A shows an adapter configured to receive two capacitor packages.
Figure 4B:
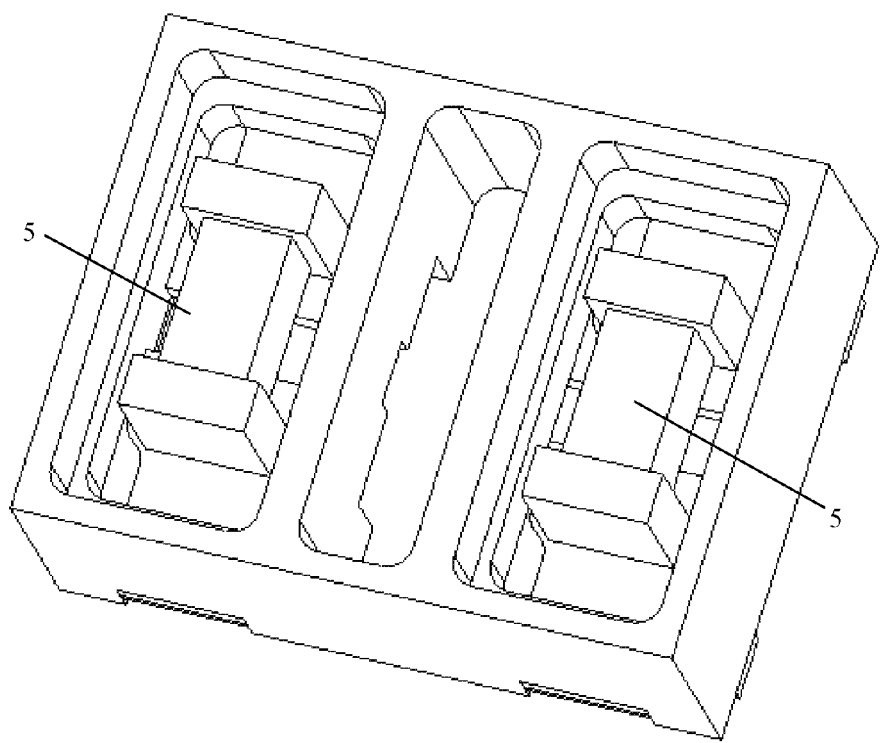
FIG. 4B is the adapter of FIG. 4A with the encapsulant removed.
Figure 4C:
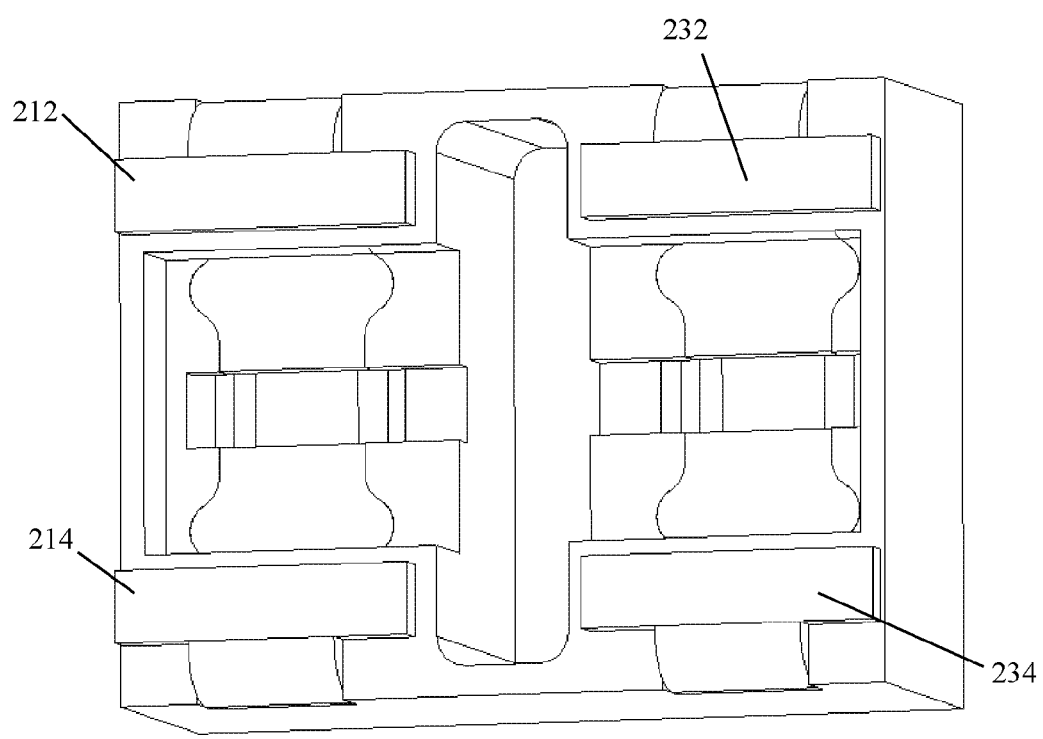
FIG. 4C is a bottom view of the adapter of FIG. 4A.

FIGS. 4A-4C illustrate a dual package adapter 200, according to another exemplary embodiment of the present invention. Referring to FIG. 4A, the dual package adapter 200 includes a housing 202 with first and second pockets (or compartments) 210, 230. The housing 202 is substantially rectangular in shape and has opposite transverse end walls 204 and opposite longitudinal side walls. The compartments 210, 230 are located toward each of the transverse end walls 204 and are separated by a transverse opening 220. The opening 220 is an elongated slot that is located at the longitudinal center of the housing 202 and extends transversely across the entire internal width of the housing 200, from one longitudinal wall 204 to the opposite longitudinal wall. The longitudinal axis of the compartments 210, 230 and opening 220 are substantially parallel to each other and substantially perpendicular to the longitudinal axis of the housing 202.

The opening 220 can be used to control the distance between the center longitudinal axes of the two components 210, 230, which allows the impedance to be controlled. Though an opening 220 is shown, it should be appreciated that a solid member between the two compartments 210, 230 can be provided or the two compartments 210, 230 can share a common wall. For instance, the opening 220 can be filled with a dielectric to control impedance of the adapter 200. Each of the compartments 210, 230 can be filled with an encapsulant similar to the encapsulant 190 of FIG. 3A.

FIGS. 4B, 4C illustrate the dual package adapter 200 of FIG. 4A without encapsulant. Here, each of the compartments 210, 230 are substantially similar to the adapter 100 of FIGS. 3A-3C. In other words, the dual package adapter 200 effectively combines two adapters 100 in a single housing 202. For instance, the two compartments 210, 230 may each contain a 0201-size package 5 and contacts that connect the package 5 to larger mating contacts at the outside of the housing 202. FIG. 4C is a bottom-up view of the dual package adapter 200 of FIGS. 4A-4B. The dual package adapter 200 includes elongated contacts 212, 214 of one package 5 parallel to and/or linear with respective contacts 232, 234 of another package 5.

As shown in FIG. 4B, the dual package adapter 200 enables two smaller packages 5 to be placed in parallel. For example, each of the packages 5 may electrically connect one signal contact in a differential pair. The dual package adapter 200 reduces electrical interference between the two packages 5 and reduces mold flow issues which may arise if the two packages 5 are placed in a single housing chamber. The dual package adapter 200 provides a path to reduce volume by allowing smaller compartments 210 and 230 to be used, which reduced impedance changes and provides an increased distance between the two devices 5. In addition, the smaller profile enables smaller impedance variation, which is particularly advantageous at higher speeds. As will be apparent, the housing 202 can be configured to accommodate more than two packages 5, and the packages can be arranged in serial fashion rather than in parallel.

Figure 5:
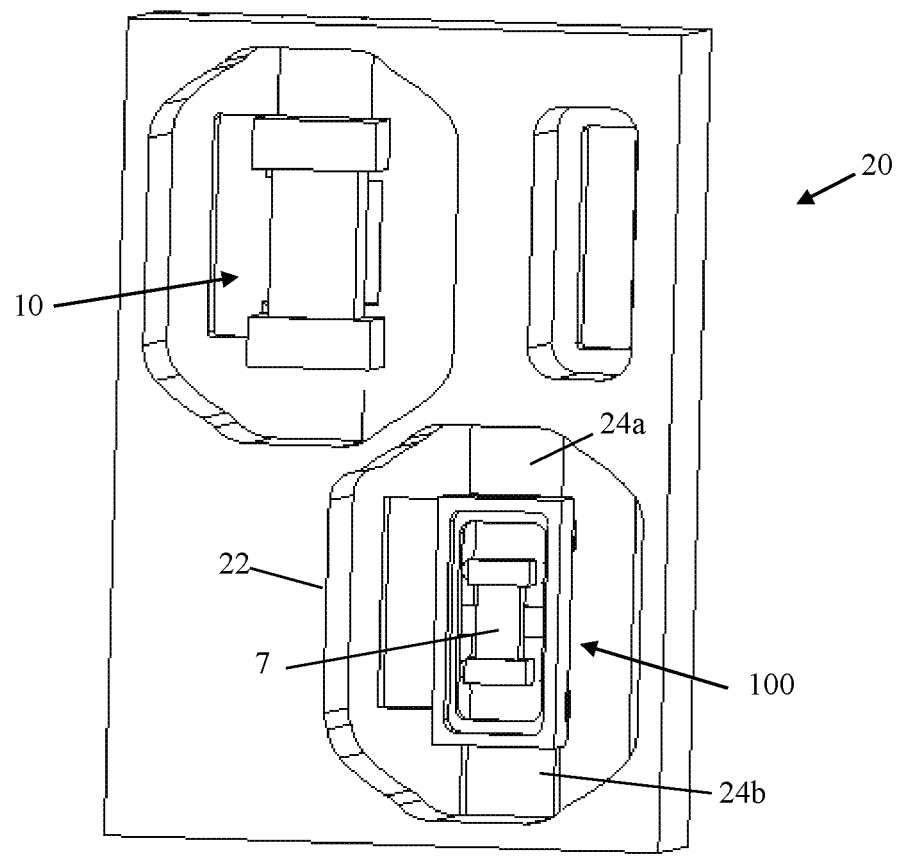
FIG. 5 is a view of the adapter placed in a wafer.

FIG. 5 illustrates the capacitor adapter 100 of FIGS. 3A-3C incorporated within the wafer 20 of FIGS. 1A, 2A, 2B, according to an exemplary embodiment of the present invention. The wafer 20 includes a standard 0402-size component 10 in the upper left opening 22 and the adapter 100 in the lower right opening 22. The adapter 100 enables a smaller component 5 (for example, a 0201-size component) to bridge a gap 26 between the conductors 24a, 24b and electrically connect the smaller component 5 to the conductor 24 of the lead frame. As illustrated in FIGS. 3A-3C, the shorter legs 166, 167 of the adapter 100 are separated by a distance that is greater than the length of the component 5, and enable the 0201-size component 5 to electrically connect with the conductors 24. The 0201-size component 5 by itself is not large enough to span the gap 26. However, the longer legs 162, 163 are closer together, such that the component is able to span the gap 170, while the shorter legs 166, 167 are further apart and can connect with the conductors 24a, 24b. Thus, the 0201-size component 5 electrically connects with the conductors 24.

Figure 6A:
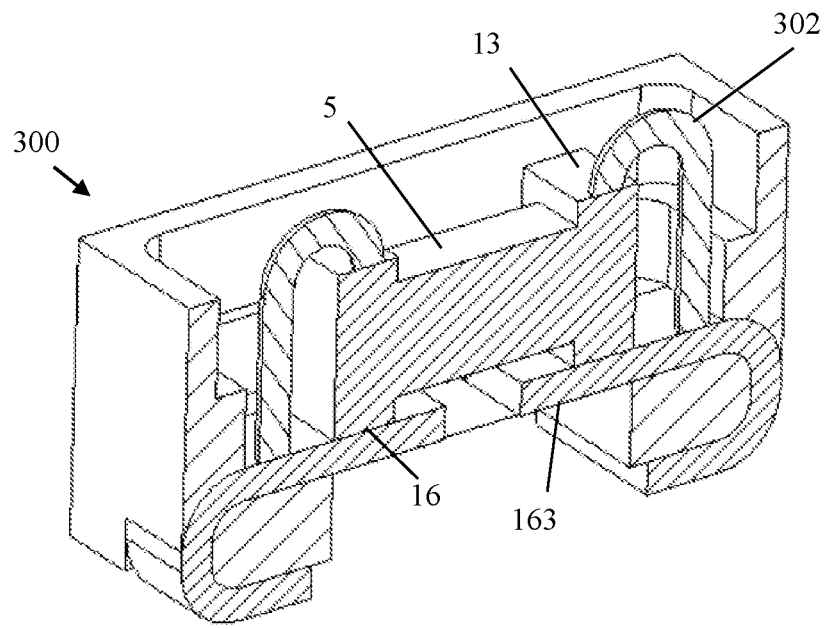
FIG. 6A is a cross-sectional side view of the adapter with wire bonds.
Figure 6B:
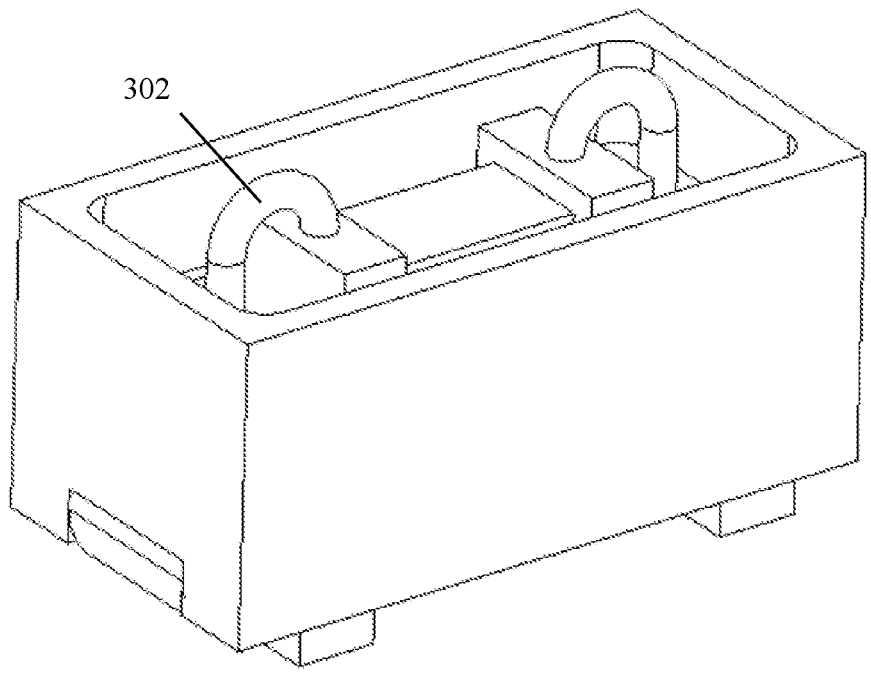
FIG. 6B is a perspective view of FIG. 6A.

FIGS. 6A, 6B show an adapter 300 according to another exemplary embodiment of the present invention. Here, the adapter 300 is the same as the adapter 100 of FIGS. 3A-3C, with the addition of wire bonding 302, which is optional. The component 5 is affixed to the contact portion 163 by the wire bonding 302. The wire bond 302 has a straight section and a curved section at the top of the straight section, to generally form an inverted J-shape. The wire bond 302 is a thin elongated round wire that extends upward from the top surface of the conductive member 160 outside of the component device 5. It has a first end that connects with the top surface of the long leg 162, 163 and a second end opposite the first end that connects with the top surface 13 of the end terminal 12 of the package 5. The housing of the adapter 100 can optionally be filled with encapsulant, and the device 5 can be soldered or adhered to the longer legs 162, 163.

Figure 7B:
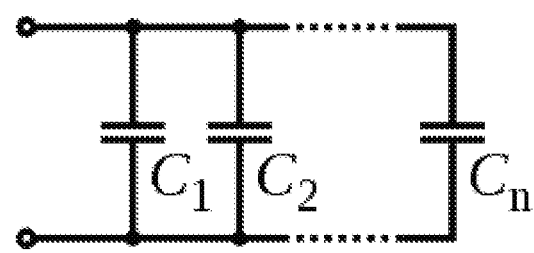
FIG. 7B is a circuit representation of the capacitor package connection of FIG. 7A.
Figure 7A:
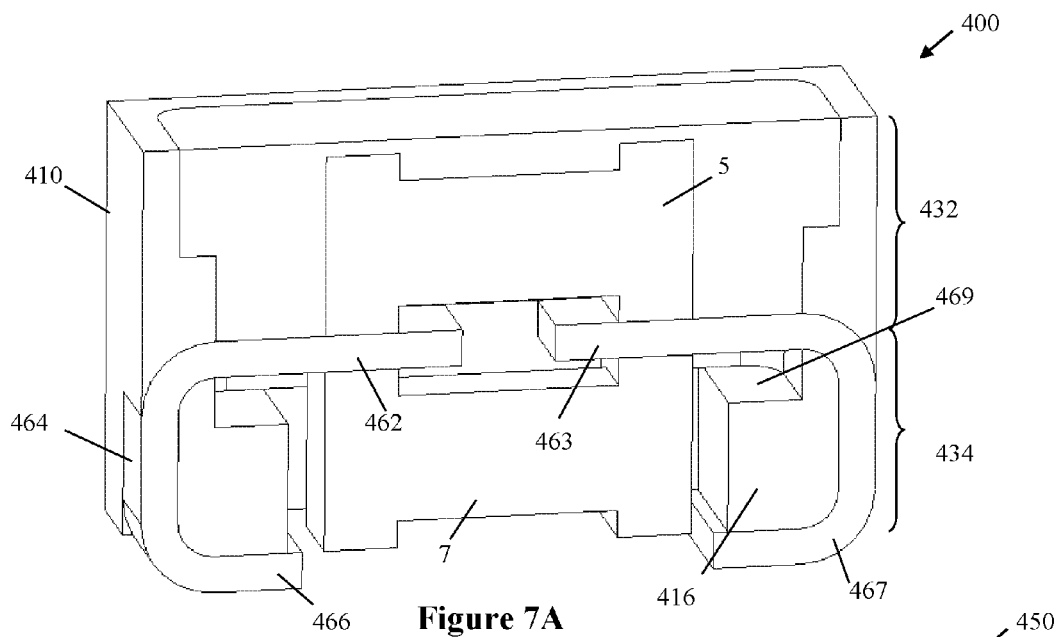
FIG. 7A is a cross-sectional side view of the adaptor receiving two capacitor packages.

FIG. 7A shows the adapter 400 according to another exemplary embodiment of the present invention. Here, the adapter 400 includes dual capacitor devices 5, 7 to illustrate the connection of multiple devices 5, 7 in a stacked or tiered configuration. An upper 0201-sized device 5 is provided at the upper section 432, and a lower 0201-sized device 7 is provided at the lower section 434. Thus, the upper and lower devices 5, 7 are vertically aligned, so that the central longitudinal axes of the devices 5, 7 are parallel with one another. Though two devices 5, 7 are shown, more devices 5, 7 can be connected.

In the current embodiment, the lower section 434 is enlarged to fit the lower device 7 by extending the curved portions 464 of the contact member 460, as shown. The support member 416 can also be enlarged to extend between the longer legs 462, 463 and shorter legs 466, 467, and/or a shelf 469 can be provided. The lower device 7 does not extend outside of the housing 410, so that the shorter legs 466, 467 remain the lowest part of the adapter 100.

The lower device 7 can be soldered or glued to the bottom (i.e., downward-facing in the embodiment shown) surface of the longer legs 462, 463. The top or bottom faces 13, 16 of the end terminals 12 can be connected to top (i.e., upward-facing) surface of the contact portion 463. Bonding wires 302 (such as shown in FIG. 6B) or printed leads can also be provided for each of the upper and lower devices 5. Although the devices 5, 7 are shown aligned with one another vertically and substantially parallel, they can be offset with respect to one another and need not be substantially parallel.

Figure 10A:
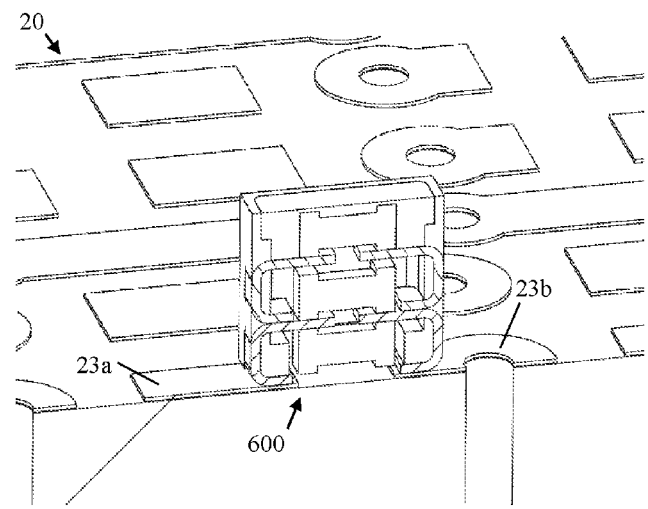
FIG. 10A is a perspective cross-sectional view of another embodiment of the invention having tiered capacitors, and connected to traces on a board.
Figure 10B:
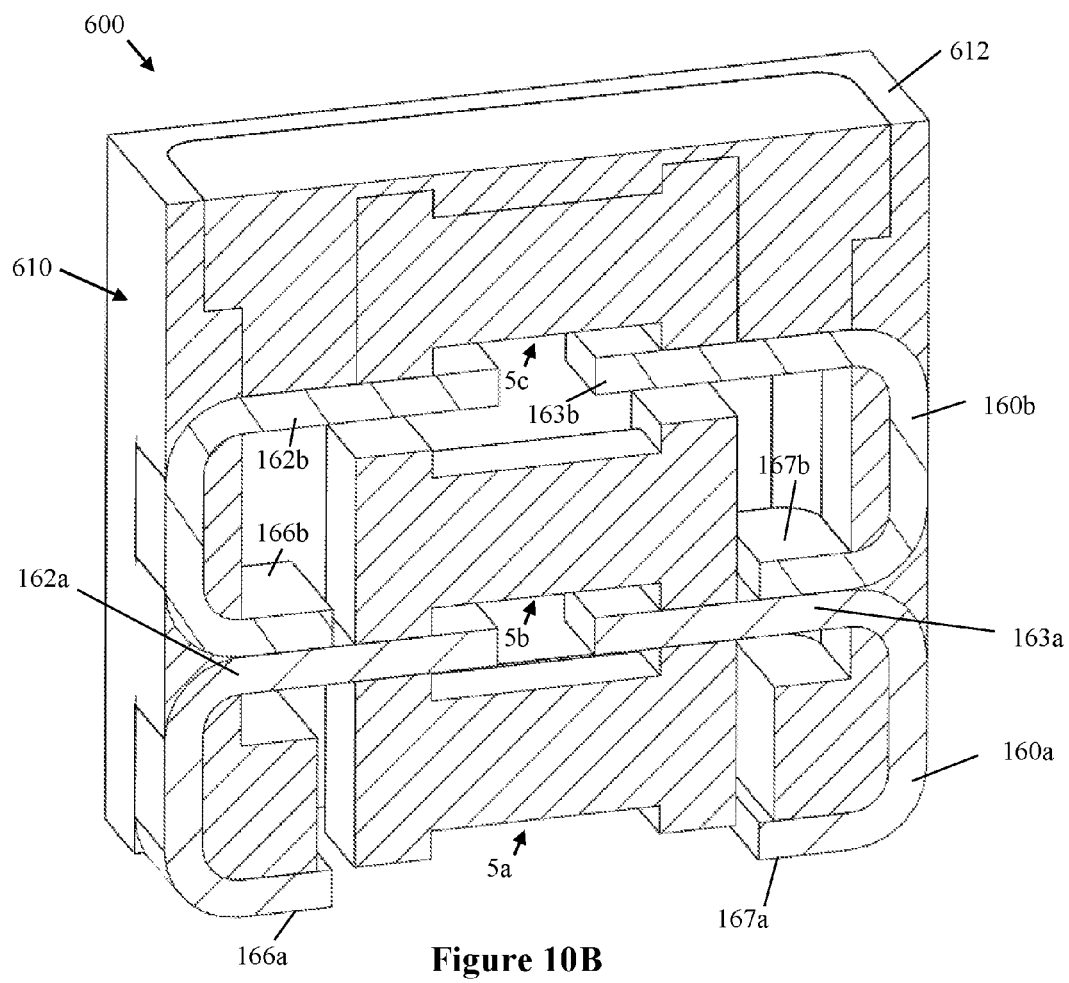
FIG. 10B is a more detailed view of FIG. 10A.

When the two capacitor devices 5, 7 are connected in the manner shown in FIG. 7A, they are connected in a parallel relationship, as represented by the circuit diagram of FIG. 7B. Accordingly, the total capacitance is the sum of the capacitance of the two capacitor devices 5, 7, or $C_{total} = C_1 + C_2 + \ldots C_n$. This enables smaller adapters to exhibit more capacitance, so that smaller value capacitor devices 5, 7 can be used. For example, 100 pFarads can be provided by placing two 50 pf capacitor devices (01005-size, which is smaller than a 0201 component) in parallel with one another. It should further be appreciated that the adapters 100 and/or 400 can be further stacked on top of one another with the devices 5, 7 connected between the two adapters 100, 400, to provide further capacitors in parallel with one another. Any number of adapters 100, 400 can be stacked, though preferably within the thickness of the wafer 20 to which the adapters 100, 400 are connected. One such embodiment is shown in FIGS. 10A, 10B.

Figure 8A:
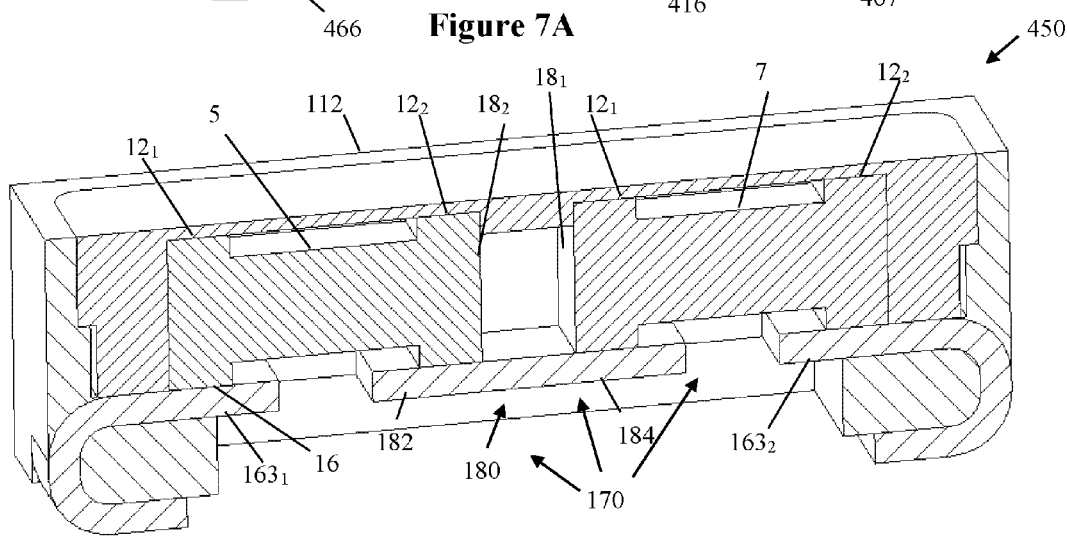
FIG. 8A is a cross-sectional side view of an adapter receiving two capacitor packages in accordance with another embodiment of the invention.

FIG. 8A shows a dual capacitor adapter 450 according to another exemplary non-limiting embodiment of the present invention. Here, the devices 5, 7 are arranged in a serial fashion or end-to-end relationship such that the end face $18_1$ of the end terminal $12_1$ of the first device 5 faces the end face $18_2$ of the end terminal $12_2$ of the second device 7. The longitudinal walls 112 of the housing 110 are extended to accommodate the two devices 5, 7, and the two longer legs $163_1$, $163_2$ are separated by a larger gap 170. A central contact member 180 is provided at the center of the housing 110. The central contact member 180 is flat and can have the same thickness as the longer legs $163_1$, $163_2$, and has a first contact end 182 and a second contact end 184 opposite the first contact end. The central contact member 180 can be supported, for instance, by the side walls of the housing, whereby the side walls can be molded about the central contact member 180. The first package 5 has a first end that connects to the first longer leg $163_1$ and a second end that connects to the first contact end 182 of the central contact member 180. The second package 7 has a first end that connects to the second contact end 184 of the central contract member 180 and to the second longer leg $163_2$.

Accordingly, with respect to the first device 5, the bottom surface 16 of the first end terminal $12_1$ connects with the first longer leg $163_1$ at the left side of the illustrated embodiment. And the bottom surface 16 of the second end terminal $12_2$ connects with the first contact end 182 of the central contact member 180. With respect to the second device 7, the bottom surface 16 of the first end terminal $12_1$ connects with the second contact end 184 of the central contact member 180. And the bottom surface 16 of the second of the second end terminal $12_2$ connects with the longer leg $163_2$ at the right side of the illustrated embodiment. The dual capacitor adapter 400 provides an in-series connection from a connector 24a of a wafer 20 (such as the one in FIG. 2A), through the longer leg $163_1$, then through the first device 5, then through the central contact member 180, then through the second device 7, then through the longer leg $163_2$, and to the lead 24b. Though not shown, the present embodiment can be combined with features of the earlier embodiments of FIGS. 3-7. For instance, two additional devices 5, 7 can be provided at the lower section 134 of the housing and connected to the contact members 163, 180, as in the manner shown in FIG. 7A.

Figure 8B:
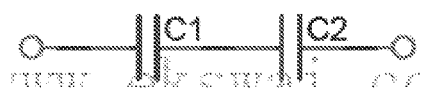
FIG. 8B is a circuit representation of the capacitor package connection of FIG. 8A.

When the capacitor devices 5, 7 are connected as shown in FIG. 8A, they are connected in series as represented by the circuit diagram of FIG. 8B. The total capacitance is then represented as $$\frac{1}{C} = \frac{1}{C1} + \frac{1}{C2}.$$

Thus, FIGS. 8A, 8B show an adapter 450 with multiple devices 5, 7 arranged in a linear fashion. Though two devices 5, 7 are shown, any suitable number of devices can be connected, such as by providing additional central contact members 180. Those central contact members can further connect the packages 5, 7 in other suitable configurations.

Figure 9A:
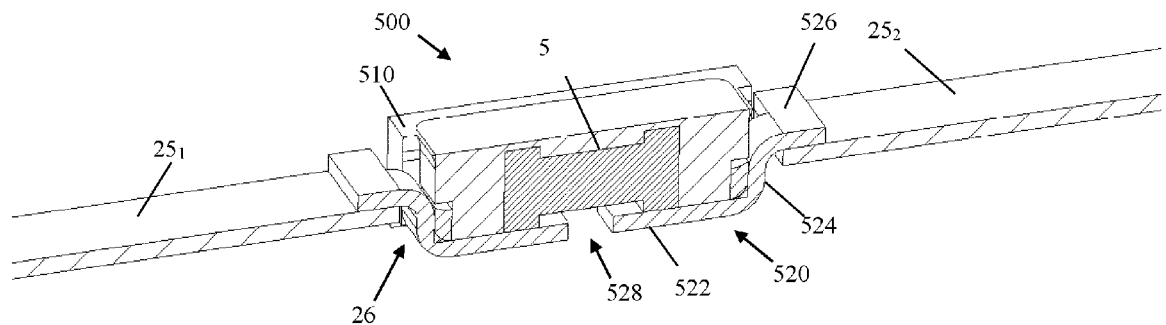
FIG. 9A is a perspective cross-sectional view of another embodiment of the invention shown connected in a connector wafer.
Figure 9B:
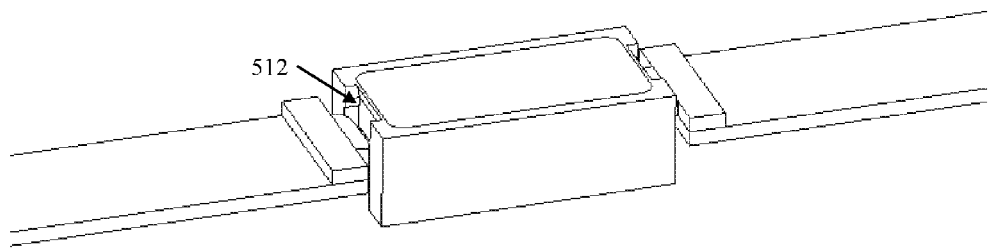
FIG. 9B is a perspective view of the adapter of FIG. 9A.

Turning to FIGS. 9A, 9B, a dual capacitor adapter 500 is shown according to another exemplary non-limiting embodiment of the present invention. The adapter 500 is configured to be connected in the gap 26 (such as the one shown in FIG. 2A) provided between two contact portions $25_1$, $25_2$ of a signal conductor. Here, the adapter includes a housing 510, elongated contact members 520, and optional encapsulant. Each of the contact members 520 are a thin elongated member having a longer leg 522, a bend portion 524 and a shorter leg 526. The longer leg 522 extends below the housing 510 and connects with the device 5, and also supports the device 5. The longer legs 522 do not meet each other, but instead a gap 528 is formed between the distal ends of the two longer legs 522. The longer leg 522 and the shorter leg 526 are substantially straight. The bend portion 524 connects the two legs 522, 526 and forms an S-shape so that the long leg 522 and the shorter leg 526 are substantially parallel to each other and offset by the bend portion 524. The shorter legs 526 connect the adapter 500 to the contact portions $25_1$, $25_2$. The shorter leg 526 is higher up than the longer leg 522, so that the profile of the adapter 500 is minimized. The length of the bend portion 524 is about one-half of the height of the device 5, so that the device 5 is substantially vertically centered with respect to the conductors $25_1$, $25_2$. That is, the conductors $25_1$, $25_2$ align with the housing 510 at about the mid-point of the housing 510. This minimizes the profile of the adapter 500.

The shorter legs 526 can have a wider width than the longer leg 522 and bend portions 524 to ensure a reliable connection with the conductors 251, 252. As best shown in FIG. 9B, the shorter legs 526 can have a width that extends the entire width of the conductors 251, 252. The shorter legs 522 of the contact member 520 can be soldered or otherwise adhered to the conductors 25. The current embodiment essentially eliminates the lower section 134 of the housing 110 of FIG. 3, which further reduces the profile of the adapter 500. In the current embodiment of the invention, the shorter legs 526 extend upward and outward with respect to the longer legs 522; whereas in FIG. 3 the longer legs 162, 163 extend upward and inward with respect to the shorter legs 166, 167.

As further shown in FIG. 9B, the longer leg 522 of the contact member 520 can be contained within the walls of the housing 510. A slot 512 is provided in the transverse ends of the housing 510 that allows the contact member 520 to exit to the exterior of the housing 510 and contact the conductors 25. Thus, the shorter legs 526 extend longitudinally out of the opposite transverse ends of the housing 510. The adapter 500 enables a small capacitive device 5 to connect with the conductors $25_1$, $25_2$ that are wider apart than the end terminals of the device 5. The contact members 520 provide a smaller gap 528 than the gap 26 between the conductors $25_1$, $25_2$, and connect to the wider conductors $25_1$, $25_2$.

FIGS. 10A, 10B shows a capacitor adapter 600 according to another exemplary embodiment of the present invention. Referring to FIG. 10A, the adapter 600 can be utilized, for instance, to electrically connect three packages 5a, 5b, 5c with conductors such as two mounting pads 23a, 23b of a printed circuit board. Turning to FIG. 10B, the capacitor adapter 600 includes a housing 610, which is similar to the housing 110 illustrated in FIGS. 3-8, and two sets of conductive members 160a, 160b. The two conductive members 160a, 160b have a similar structure and purpose to the conductive members 160 illustrated in FIGS. 3-8, each with shorter legs 166a, 167a, 166b, 167b, and longer legs 162a, 163a, 162b, 163b, respectively. The device 5 can be adhered (e.g., soldered) to the legs 522, and the short legs 526 can be adhered (e.g., welded) to the conductors, which for instance can be the leads 24a, 24b (FIG. 2A) or the traces 23a, 23b (FIG. 10A).

The first conductive member 160a is electrically connected to the first and second devices 5a, 5b in a similar manner as illustrated in FIG. 7A. The shorter legs 166b, 167b of the second conductive member 160b rest on and electrically connect with the longer legs 162a, 163a of the first conductive member 160a, and the longer legs 162b, 163b connect to the third device 10c. The curved portion of the second conductive member 160b is long enough so that the second device 10b does not touch the longer legs 162b, 163b of the second conductive members 160b. When the three capacitor devices 5a, 5b, 5c are connected in the manner shown in FIG. 10B, they are connected in a parallel relationship. Accordingly, the total capacitance is the sum of the capacitance of the three capacitor devices 5a, 5b, 5c, or Ctotal=C1+C2+ . . . Cn. Encapsulant is provided at the top part of the interior space of the housing 610 about the third package 10c to seal the entire housing 610, though encapsulant can optionally be provided about the first and second packages 10a, 10b as well. In addition, while the second package 10b is shown connected to the longer legs 162a, 163a of the first conductive member 160a, it can instead be connected to the longer legs 162b, 163b of the second conductive member 16b. As further shown, the shorter legs 166b, 167b must be wider apart than the length of the second package 10b. In an alternative embodiment, the shorter legs 166b, 167b can be closer together so that the second package 10b rests on top of the shorter legs 166b, 167b.

Though three devices 5a, 5b, 5c are shown in FIG. 10B, additional devices can be provided in the vertically stacked or tiered configuration. In addition, one or more of the tiers can be expanded in the horizontal direction, as in the embodiment of FIG. 8A. Thus, the adaptors can be configured to expand in two directions that are orthogonal to one another. The adaptors can be elongated to connect devices in a serial fashion, as in FIG. 8A, and those adaptors can also be stacked with one another, as in FIGS. 7A, 10B.

As discussed and shown above, the adapters of FIGS. 3-10 electrically can be utilized in a number of configurations. For instance, the adapter can be used to connect a package or device 5, 10 to a conductor 24, 25 (see FIGS. 5, 9A) of an electrical connector wafer (such as connectors $20_1$, $20_2$ of FIG. 1A) or to mounting pads 23a, 23b on the surface of a printed circuit board (such as boards 30, 40 and/or backplane board 50 of FIG. 1A). For instance, the longer legs 162, 163 of the adapters provide a reliable contact surface for attachment of the devices 5, 10. The device 5, 10 can be adhered (such as by solder or the like) to the longer legs 162, 163 and provide a reliable connection joint. And the shorter legs 166, 167 provide a reliable contact surface for attachment of the adapter to a conductor 24, 25. The adapter can be adhered (such as by solder or welding) to the conductors 24, 25 and provide a reliable connection joint. The housing and encapsulant further protect the device 5, 10 from electrical disturbances. And, the adapters are substantially the same width as the conductors 24, 25 to which they attach.

Figure 11A:
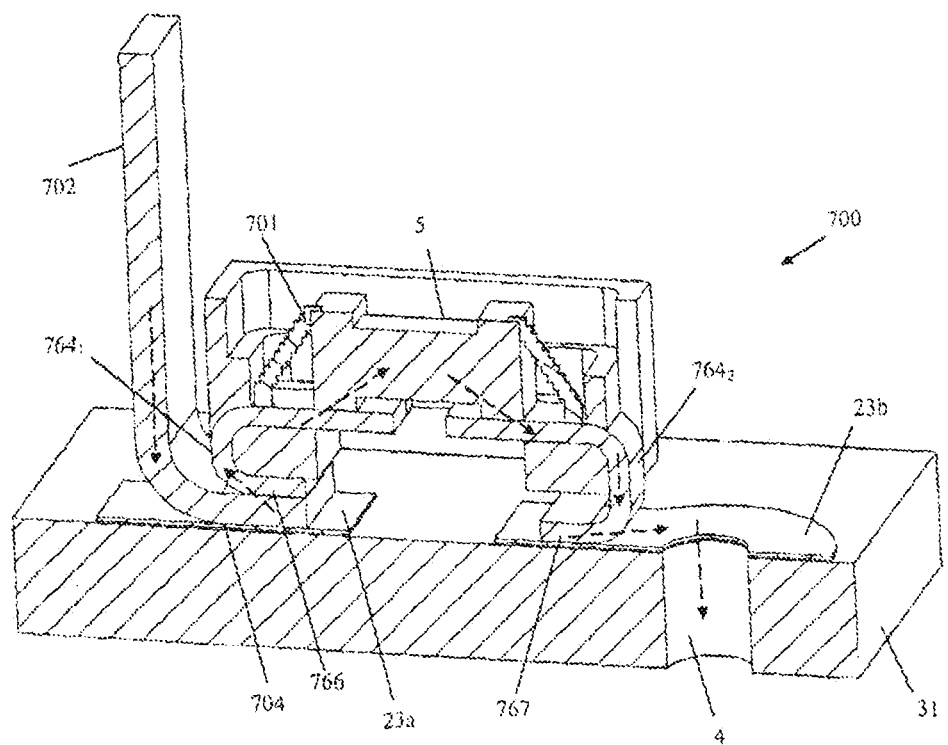
FIG. 11A is a perspective cross-sectional side view of the adapter connected to a signal conductor, without encapsulant.

Another embodiment of the invention is shown in FIG. 11A. Here, the adapter 700 is connected to mounting pads 23a, 23b on the surface of a printed circuit board (such as boards 30, 40 and/or 50 of FIG. 1A). As shown, the tail 702 of a signal conductor extends downward and connects to the mounting pad 23a. The tail 702 is elongated and thin and has a bend forming a foot 704, whereby the tail 702 has an L-shape with the tail 702 substantially orthogonal to the main body of the tail 702. The bottom surface of the foot 704 is directly connected to the top surface of the conductive mounting pad 23a. The foot 704 has a flat top surface.

The adapter 700 is the same as the adapter 300 of FIGS. 6A, 6B above. However, a printed lead 701 is provided instead of a wire bond 302. The printed lead 701 can be generated, for instance, by Optomec Mfg., www.optomec.com. Novel shapes and sizes can be created that do not require heat (i.e., solder and the associated reflow cycle to address issues with lead free related heat cycle) that may warp or damage properties of the connector or package adaptor that are heat sensitive if desired. The bond strength of this approach is superior to adhesive.

In addition, the curved portion $764_2$ is slightly elongated compared with the curved portion $764_1$. The bottom surface of the shorter leg 766 directly contacts the top surface of the foot 704 of the conductor tail 702. Accordingly, the curved portion $764_2$ is longer than the curved portion $764_1$ by a distance that equals the thickness of the foot 704 (if the signal conductor mounting pad 23a has the same thickness as the via mounting pad 23b), so that the adapter 700 remains level when connected with the mounting pads 23a, 23b.

Accordingly, current passes through the adapter 700 in the direction shown by the dashed arrows. The current comes in from the conductor tail 702 to the mounting pad 23a (the mounting pad 23a provides a reliable contact for the tail 702, but can be eliminated if desired) and the shorter leg 766. The current continues from the shorter leg 766, through the curved portion $764_1$ to the longer leg. The current then passes through the capacitor package 5, and out through the longer leg and curved portion $764_2$. It continues through the shorter leg 767 to the mounting pad 23b and into the conductive via 4. For instance with respect to FIG. 1A, the tail can be from either of the connectors $20_1$, $20_2$, and the via 4 can be any of the vias $48_1$, $48_2$, $54_1$, $54_2$, $38_1$, $38_2$, $52_1$, $52_2$.

Figure 11B:
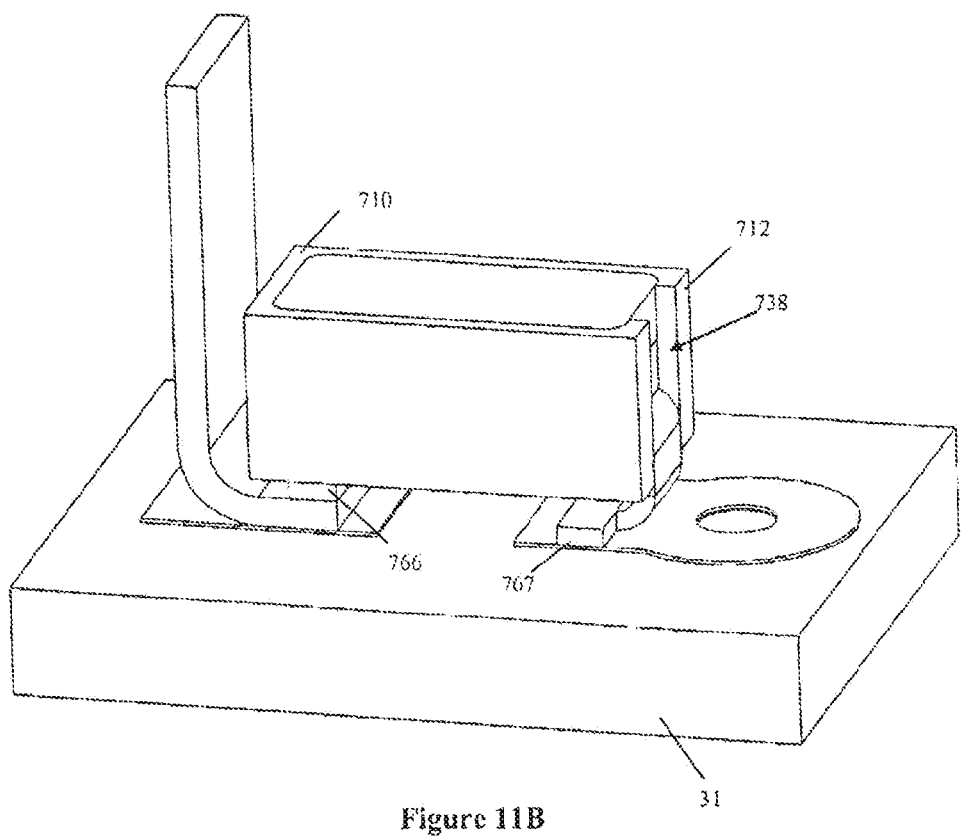
FIG. 11B is a perspective view of the adapter of FIG. 11A with encapsulant.

As best shown in FIG. 11B, the shorter legs 766, 767 can be wider than the curved portions $764_1$, $764_2$, and extend substantially the entire width of the tail foot 704 and mounting pad 23b respectively, to which they are connected.

Thus, the adapter 700 enables the capacitor 5 to share the same via 4 as the signal conductor tail 702. The adapter 700 directly contacts the signal conductor tail 702, thus conserving space on the board 30, 40, 50 while providing a reliable contact between the capacitor 5 and the signal conductor tail 702. The curved portion $764_2$ is longer than the curved portion $764_1$ so that the package 700 remains substantially horizontal when connected to the tail 702 and mounting pad 23b, as shown. However, the package 700 need not be horizontal, or other configurations can be provided to keep the package horizontal without having the curved portion $764_2$ be longer than the curved portion $764_1$.

As further shown in FIG. 11B, the opening 738 in the side wall 712 of the housing 710 can be enlarged to provide additional ways to mold and stamp this area. For instance, the opening 138 allows exposed metal that will form a fillet when soldered to lead frame conductor 24. The fillets add strength to the solder bond between conductor 24 and adapter conductor 160, leading to improved long term package reliability and resistance to shock, environmental stress and strains due to thermal cycling in situ and during press fit assembly. And encapsulant can be provided at the interior space of the housing 710.

Figure 12:
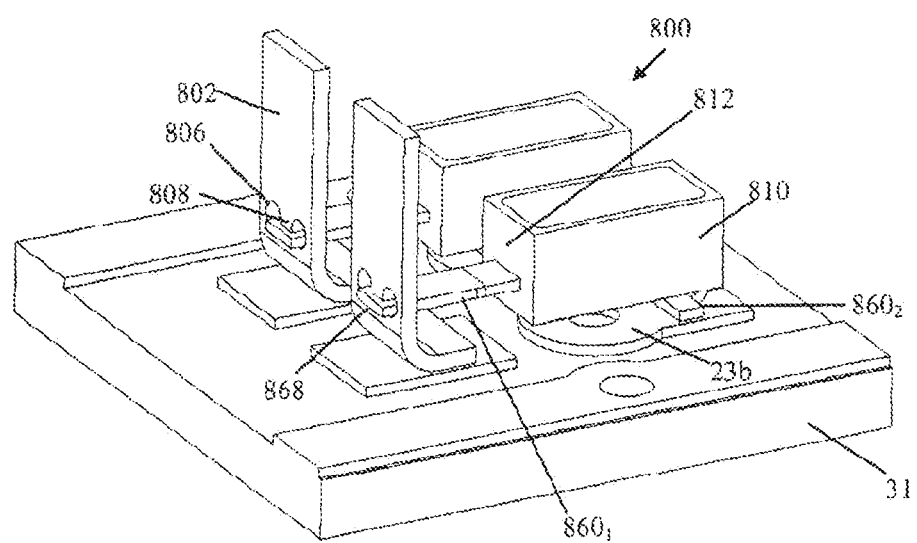
FIG. 12 is a perspective view of another embodiment of the invention.

FIG. 12 illustrates an adapter 800 according to another exemplary embodiment of the present invention. Two adapters 800 are shown, each connected to a respective signal conductor tail 802, which can be utilized for instance to form a differential pair. It is noted that in FIG. 11A, the mounting pad 23b extends away from the adapter 700; whereas in FIG. 12, the mounting pad 23b extends beneath the adapter 800 so that the via is located beneath the adapter 800. This allows additional space to be conserved on the substrate 31 (which can be any of boards 30, 40, 50 of FIG. 1A, for instance).

As further shown in FIG. 12, a pierce tab mount through lead is provided. Accordingly, one of the contact members $860_1$ is a straight elongated member that does not have any curved portion. The straight contact member $860_1$ extends from the interior of the adapter housing 810 straight out of the transverse side wall 812 of the housing 810 through a correspondingly-shaped and sized opening in the side wall 812. The straight contact member $860_1$ has a longitudinal axis that is parallel to the longitudinal axis of the package housing 810. In addition, the signal conductor tail 802 has a central opening 806 with a downwardly extending mating projection or tab 808 that extends downwardly (in the embodiment shown) from the top of the opening 806. The opening 806 is aligned with the straight contact member $860_1$.

During assembly, the adapter 700 is angled with an opening in the distal end of the straight contact member $860_1$ aligned with the tab 808. The distal end portion 868 of the straight contact member $860_1$ extends slightly through the opening 806, so that the mating tab 808 engages the distal end portion of the straight contact member $860_1$. The straight contact member 860 goes directly through the conductor tail 802 to provide direct mechanical attachment to the lead frame. Solder can be filled in after a solder attach cycle to provide superior strength of bond or just another method to get the capacitor adaptor into the footprint of the PCB board launch area. The adapter 700 is then lowered to be level with the top surface of the substrate 31, and so the curved contact member $860_2$ comes into contact with the mounting pad 23b. The straight contact member $860_1$ can rest on the bottom edge or surface of the opening 806 of the tail 802 for support. The contact member $860_1$ can then be soldered or adhered into position in connection with the tab 808.

The other adapter contact member $860_2$ can have a curved portion and directly couple the mounting pad 23b, as in FIG. 11. Current flows from the signal conductor tail 802, through the contact member $860_1$, through the capacitor, and along the contact member $860_2$ to the mounting pad 23b and related via. Thus, the signal conductor 802 shares the same via as the capacitor. This does not significantly change the transmission at high frequencies, while blocking DC.

Figure 13:
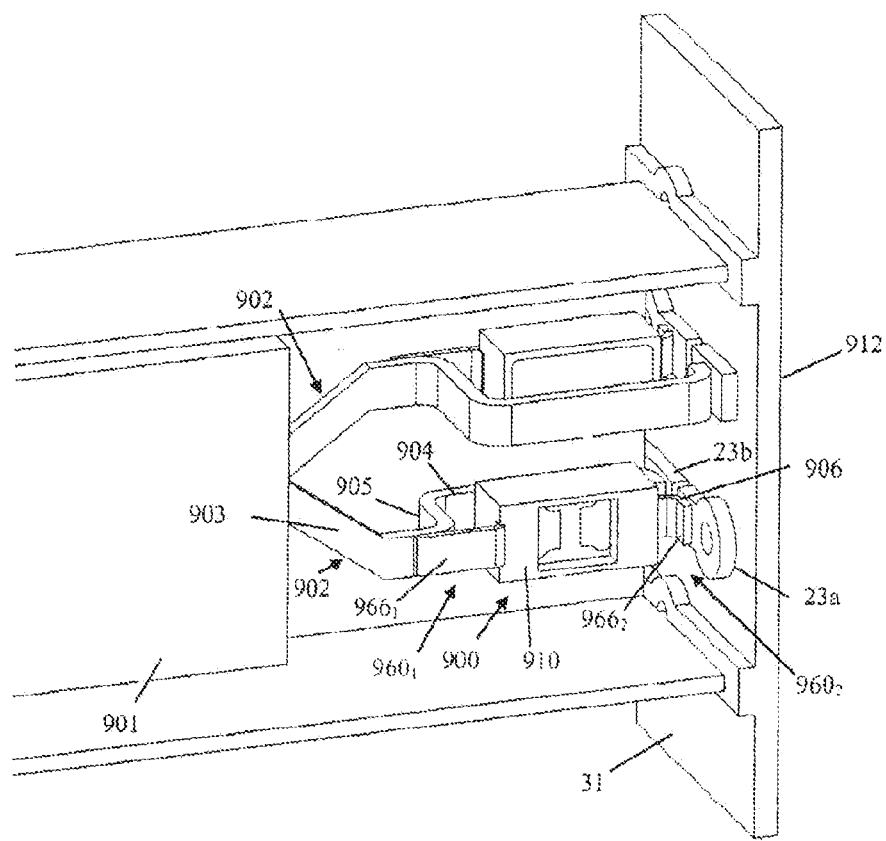
FIG. 13 is a perspective view of another embodiment of the invention mounted vertically.

FIG. 13 illustrates an adapter 900 according to another exemplary embodiment of the present invention. The adapter 900 is the same as in FIG. 3A, but the contact members $960_1$, $960_2$ are configured to couple with a signal conductor 902 that is at an angle. More specifically, the signal conductor has a proximal portion 903 that extends toward the top surface of the substrate 31, but at an angle to the substrate 31. The proximal portion also extends from the connector housing 901 at an angle. The signal conductor 902 also has a distal portion that is configured to form a general U-shape with two upturned sides 905, 906 and a bottom portion 904. That shape supports the capacitor adaptor by adding mounting strength and stiffening the overall attach zone to resist stress and strain during actual use. For instance, one contact $966_1$, $966_2$ can be thinner and less stiff (as shown) than the distal portion so that side is flexible, which in turn protects the adaptor housing and contents. The lead side wall 904 carries the mechanical load, and the capacitor contact legs $966_1$-$966_2$ carry the electrical signal. The housing 910 of the capacitor package 900 substantially fits between the two sides 905, 906 and can rest on the top surface of the side 906. The side 904 forms a foot for the signal conductor 902 and contacts the mounting pad 23b.

The first contact member $960_1$ has a curved portion that curves downward and outward. Accordingly, the shorter leg $966_1$ extends outward from the adapter housing 910 (instead of inward and under the housing 110 as in FIG. 3A). The shorter leg $966_1$ of the first contact member $960_1$ rests against the top surface of the angled distal portion 903 of the signal conductor 902, as shown. The shorter leg $966_1$ can be relatively rigid, so that it exerts a pressure on the distal portion 903 to provide a reliable contact. The shorter leg $966_1$ can be uniform in width.

The shorter leg $966_2$ of the second contact member $960_2$ can be turned outward from the bottom surface of the housing 910, to be substantially parallel to the side 912 (i.e., substrate 31 in the embodiment of FIG. 13) of the housing 910 and substantially parallel to the top surface of the substrate 31 and the mounting pad 23a. The shorter leg $966_2$ can be curved slightly outward from the housing 910 as well. The shorter leg $966_2$ can have a wide head that is substantially extends the entire width of the mounting pad 23a. The upper and lower signal conductors 902 (in the embodiment shown) are the same, but the signal conductors are reversed. That is, the upper signal conductor 902 faces in one direction so that the conductor 902 is on one side of the package 5, and the lower signal conductor 902 faces in an opposite direction so that the conductor 902 is on the opposite side of the package 5.

FIGS. 11-13 illustrate that the adapter contact members can have any suitable configuration and mate with signal conductors in different ways, and that both of the contact members need not have the same configuration. For instance, contact members extend different distances away from the housing (FIG. 11); contact members can be straight or curved (FIG. 12); contact members can rest on the foot of a signal conductor tail (FIGS. 11, 12); contact members can extend into an opening in the signal conductor tail (FIG. 12); contact members can extend outward from a bottom of the side wall (FIG. 13); and/or contact members can extend parallel to the side wall (FIG. 13). The invention is not limited by the illustrated embodiments of the invention. FIGS. 11-13 provide additional techniques that provide a more robust attach.

As noted, the adapters are especially designed for use with the packages 5, 10, and have particular utility with the wafer of FIG. 2A. However, it will be apparent that the adapters can be utilized with other circuit elements having different sizes, shapes and configurations, and can be utilized in other connectors, and not with the specific packages 5, 10 shown. In addition, while a single package 5 is shown connected to the top surface of the longer legs 162, 163 in FIG. 3, it can instead be connected to the bottom surface of the longer legs 162, 163.

As further noted, the smaller legs 166, 167 have flat bottom surfaces that directly contact the surface to be mated with and form a reliable electrical connection therewith. However, other configurations can be provided. For instance, the bottom surface need not be flat, but can have a projection that forms a contact point that mates with a flat surface. Or, the smaller leg can form a pressfit or other connection that mates with a respective contact.

The figures and description are provided to illustrate the invention as being and adapter configured to respectively connect two contacts of an electronic component to two target contact surfaces that are wider apart than the length of the component. The adapter provides a first set of two contacts (such as an upper contact and a lower contact) and a second set of two contacts (such as upper contact and a lower contact). The two lower contacts can be separated from each other by a first distance that aligns with the target contact surfaces. The two upper contacts can be separated from each other by a second distance smaller than the first distance, so that the upper contacts are aligned with the contacts of the electronic component. The first set of upper and lower contacts can be directly connected together, such as being formed from a same elongated contact member that is bent toward one end to form a U-shape. And the second set of upper and lower contacts can be directly connected together, such as being formed from another elongated contact member that is bent at one end to form a U-shape bend so that the upper and lower contacts are parallel to each other and the component is above the target contact surfaces.

It is noted that the invention has been described and shown as an adapter 100-900 (FIGS. 3-13) for use in a connector such as the wafer of FIGS. 1A, 2A, 2B. It is further noted that the invention includes the connector having leads or conductor elements (such as conductor elements 24, 25 (FIGS. 1A, 9A) with the adapter 100-900 coupled to the conductor elements 24, 25.

In yet another embodiment of the invention, the adapters 100-900 of FIGS. 3-13 protect the enclosed devices 5, 10 from environmental conditions. So for instance, the entire adapter can be over molded without damaging the device 5, 10. Accordingly, a wafer (such as the wafer 20 in FIGS. 1A, 2A, 2B) can be formed by (a) providing a lead frame having one or more elongated conductors, (b) forming gaps in the conductors 24 to provide conductor ends 24a, 24b, (c) placing one of the adapters 100-900 to span the gap and connect with the conductor ends 24a, 24b, and then (d) over molding the entire lead frame (which would not leave any openings 22 in the insulative over molding). The passive devices 5, 10 cannot be directly over molded (in FIG. 2A) since the over molding process involves high heat, high heat differentials and/or high pressures can develop in short periods of time (e.g., 11,000 psi in ²⁄₁₀ths of a second), and those pressures may not be uniformly distributed. Those factors can destroy the device 5, 10 or otherwise cause the device 5, 10 to fail or become unstable or unreliable. Thus in the earlier embodiments (e.g., FIG. 2A), the lead fame is over molded first and then openings 22 are formed in the over molding 23 and the devices 10 are placed therein.

However, the adapters 100-900 of the present invention contain encapsulant and have a housing (such as housings 110, 510) so that the device 5, 10 is not directly exposed to the over molding and are not destroyed during the over molding process. The encapsulant and/or housing protect the device. The housing of the adapters 100-900 can have a bottom and top to fully enclose the circuit element 5, 10, or the bottom and top can be open (as shown) and encapsulant provided at the bottom and/or top to at least partially enclose the circuit element.

The encapsulation can be done with a needle that dispenses a liquid conformal coating that sits around the capacitor, or the capacitor can otherwise be submerged in the encapsulant. The capacitor encapsulant is then exposed to UV light, which cures the encapsulant to make it hard by cross linking the polymers to create a solid. This process uses very little heat and little to no force is required. Accordingly, the passive device can be encapsulated without destroying the passive device. The encapsulated passive device can then be coupled to the lead frame and the lead frame with the encapsulated passive device can be over molded. The encapsulant protects the passive device from being destroyed during the over mold process.

In the current embodiment, the adapter can be a housing that encloses a package 5, 10, conductors, and encapsulant. The conductors can extend from the package 5, 10 to outside the housing to couple with the conductive elements 24a, 24b, or 25. The housing is filled with an encapsulant to surround the package 5, 10 and protect the package 5, 10. The package 5, 10 can be large enough to span the gap 26 by itself without the conductors having to extend outward beyond the package 5, 10. Thus, the adapter need only encapsulate the package 5, 10 to protect the package during over molding, and need not enlarge the footprint of the package 5, 10.

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:
1. An adapter comprising:
a housing defining an interior space;
a first elongated contact member fixed to the housing and including:
 a first end configured to mate with a first contact of an electronic component;
 a second end configured to mate with a first contact of an electronic element; and
 a curved section located at least partially within the housing and between the first end of the first elon- gated contact member and the second end of the first elongated contact member; and a second elongated contact member fixed to the housing and including:
a first end configured to mate with a second contact of the electronic component, wherein the first end of the first elongated contact member and the first end of the second elongated contact member are co-linear, aligned with each other, and separated from each other by a first gap;
a second end configured to mate with a second contact of the electronic element, wherein the second end of the first elongated contact member and the second end of the second elongated contact member are co-linear, aligned with each other, and separated from each other by a second gap; and
a curved section located at least partially within the housing and between the first end of the second elongated contact member and the second end of the second elongated contact member.

2. The adapter of claim 1, wherein the second gap is wider than the first gap.

3. The adapter of claim 1, wherein said curved sections form U-shapes whereby the second ends are substantially parallel to the first ends and located below said housing.

4. The adapter of claim 1, wherein said housing comprises two lateral end walls and two longitudinal side walls and said curved sections form S-shapes whereby the second ends are substantially parallel to the first ends and extend outward from the lateral end walls.

5. The adapter of claim 1, further comprising said electronic component.

6. The adapter of claim 1, further comprising encapsulant filling at least a portion of the interior space.

7. The adapter of claim 1, wherein said housing comprises two lateral end walls and two longitudinal side walls.

8. The adapter of claim 1, wherein the electronic element comprises a printed circuit board.

9. The adapter of claim 1, wherein the electronic element comprises a second electronic component.

10. An adapter comprising:
a housing defining an interior space;
a first contact member having a first end with a first contact surface, a second end having a second contact surface, and a curved section located at least partially within the interior space of the housing and between the first end and the second end; and
a second contact member having a first end with a first contact surface, a second end having a second contact surface, and a curved section located at least partially within the interior space of the housing and between the first end and the second end;
wherein the first end of said first and second contact members are located within the interior space of said housing, and the second end of said first and second contact members are located outside the interior space of said housing; and
wherein the first contact surfaces of said first and second contact members are co-linear, aligned with and spaced apart from each other by a first distance, and the second contact surfaces of said first and second contact members are co-linear, aligned with and spaced apart from each other by a second distance.

11. The adapter of claim 10, wherein the second distance is greater than the first distance.

12. The adapter of claim 10, wherein said curved sections form U-shapes whereby the second ends are substantially parallel to the first ends and below said housing.

13. The adapter of claim 10, wherein said housing comprises two lateral end walls and two longitudinal side walls and said curved sections form S-shapes whereby the second ends are substantially parallel to the first ends and extend outward from the lateral end walls.

14. The adapter of claim 10, further comprising a first electronic component coupled to the first contact surface of the first contact member and to the first contact surface of the second contact member.

15. The adapter of claim 10, further comprising encapsulant filling at least a portion of the interior space.

16. The adapter of claim 10, wherein said housing comprises two lateral end walls and two longitudinal side walls.

17. An adapter comprising:
a housing;
a first elongated conductor having a U-shaped bend located at least partially within the housing and forming a shorter leg portion and a longer leg portion; and
a second elongated conductor having a U-shaped bend located at least partially within the housing and forming a shorter leg portion and a longer leg portion, wherein said second elongated conductor faces said first elongated conductor such that the longer leg portion of said second elongated conductor is linearly aligned with the longer leg portion of said first elongated conductor and the shorter leg portion of said second elongated conductor is linearly aligned with the shorter leg portion of said first elongated conductor.

18. The adapter of claim 17, further comprising a first gap between the longer leg portions and a second gap between the shorter leg portions, wherein the first gap is substantially smaller than the second gap.

19. The adapter of claim 17, further comprising an electrical device having a first end connected to the longer leg portion of said first elongated conductor, and a second end connected to the longer leg portion of said second elongated conductor.

20. An apparatus comprising:
a signal conductor having a first conductor segment and a second conductor segment separated from the first conductor segment to form a gap therebetween;
an adapter comprising:
a housing defining an interior space;
a first contact member having a first end with a first contact surface, a second end having a second contact surface, and a curved section located at least partially within the interior space of the housing and between the first end and the second end;
a second contact member having a first end with a first contact surface, a second end having a second contact surface, and a curved section located at least partially within the interior space of the housing and between the first end and the second end;
a circuit element located within the interior space of said housing;
wherein the first end of said first and second contact members are connected with the circuit element; and
wherein the second end of said first and second contact members extend outside the housing and connect with the first conductor segment and the second conductor segment, respectively.

* * * * *